United States Patent
Pfaff et al.

(10) Patent No.: US 7,902,886 B2
(45) Date of Patent: Mar. 8, 2011

(54) MULTIPLE REFERENCE PHASE LOCKED LOOP

(75) Inventors: Dirk Pfaff, Ottawa (CA); Claus Reitlingshoefer, Kanata (CA); Stephen Robert Hobbs, Ottawa (CA)

(73) Assignee: Diablo Technologies Inc., Gatineau, Quebec (CA)

( * ) Notice: Subject to any disclaimer, the term of this patent is extended or adjusted under 35 U.S.C. 154(b) by 0 days.

(21) Appl. No.: 12/259,315

(22) Filed: Oct. 28, 2008

(65) Prior Publication Data
US 2009/0115472 A1 May 7, 2009

Related U.S. Application Data

(60) Provisional application No. 61/000,915, filed on Oct. 30, 2007.

(51) Int. Cl.
*H03L 7/06* (2006.01)
(52) U.S. Cl. .................................. 327/147; 327/156
(58) Field of Classification Search .................. 327/147, 327/158
See application file for complete search history.

(56) References Cited

U.S. PATENT DOCUMENTS

| | | | |
|---|---|---|---|
| 4,509,043 A | 4/1985 | Mossaides | |
| 4,654,720 A | 3/1987 | Tozawa | |
| 4,907,075 A | 3/1990 | Braudaway | |
| 5,119,186 A | 6/1992 | Deacon | |
| 5,181,014 A | 1/1993 | Dalrymple | |
| 5,418,895 A | 5/1995 | Lee | |
| 5,696,539 A | 12/1997 | Welti | |
| 5,748,569 A * | 5/1998 | Teodorescu et al. | 368/118 |
| 5,909,149 A * | 6/1999 | Bath et al. | 331/2 |
| 6,084,479 A * | 7/2000 | Duffy et al. | 331/17 |
| 6,489,852 B1 * | 12/2002 | Beaulieu | 331/25 |
| 6,653,874 B2 * | 11/2003 | Ishikawa | 327/144 |
| 6,661,293 B2 * | 12/2003 | Paananen | 331/10 |
| 6,968,027 B2 * | 11/2005 | Fukuhara | 375/376 |
| 7,064,617 B2 * | 6/2006 | Hein et al. | 331/16 |
| 7,088,155 B2 * | 8/2006 | Takahashi | 327/144 |
| 7,155,191 B2 * | 12/2006 | Wego et al. | 455/265 |
| 7,436,227 B2 * | 10/2008 | Thomsen et al. | 327/147 |
| 7,642,827 B2 * | 1/2010 | Kwak | 327/158 |
| 2008/0007365 A1 * | 1/2008 | Venuti et al. | 331/179 |
| 2008/0100354 A1 * | 5/2008 | Lee | 327/158 |
| 2009/0295441 A1 * | 12/2009 | Kwak | 327/158 |
| 2009/0295442 A1 * | 12/2009 | Kwak | 327/158 |

OTHER PUBLICATIONS

JEDEC Standard Proposal, FB-DIMM Draft Specification: Architecture and Protocol Mar. 2005.

* cited by examiner

*Primary Examiner* — Lincoln Donovan
*Assistant Examiner* — Adam D Houston

(57) ABSTRACT

A multi reference phase locked loop (MPLL) generates a high speed clock frequency and phase locks it to a lowest common reference frequency derived from a selected one of at least two reference clocks. One of the reference clocks is a system reference clock in a FBDIMM system, another may be a forwarded clock in an AMB2. A prescaler reduces the frequency of at least the forwarded clock to the lowest common reference frequency which is the frequency of the system reference clock. A PLL at the core of the MPLL may be locked to the forwarded clock or the system reference clock for generating a high speed clock. A feedback divider generates the feedback clock for the PLL as well as other clocks required in the system. Furthermore, the MPLL provides a number of clocking modes, including modes to facilitate testing and powering down of sections of the circuitry for conserving power.

20 Claims, 15 Drawing Sheets

MULTIPLE REFERENCE PHASE LOCKED LOOP

RELATED APPLICATIONS

The present application claims priority from the U.S. Provisional Application to PFAFF, Dirk Ser. No. 61/000,915 filed Oct. 30, 2007 entitled "MULTIPLE REFERENCE PHASE LOCKED LOOP", which is incorporated herein by reference.

FIELD OF THE INVENTION

The present invention relates to feedback control systems, in particular to phase locked loops and clock generation apparatus that is required to generate a multitude of clock frequencies based on clock references that can be substantially different in frequency and spectral content.

BACKGROUND OF THE INVENTION

In the context of, but not limited to, point-to-point fully buffered DIMM (dual in-line memory module) memory subsystem to be abbreviated as FBDIMM, system clocking for the high-speed serial point-to-point links between devices is one of the most critical areas of design. Within the field of FBDIMM, there exist two generations of architecture which support two different memory types and have two different system clocking schemes. The first generation, which will be referred to as FBDIMM1, supports DDR2 Double Data Rate memory speeds and has a simple system clocking scheme where a single reference clock is distributed to all devices in the memory subsystem and each device is then responsible for generating local high-speed clocks and performing local clock recovery on high speed links. The second generation, which will be referred to as FBDIMM2, supports DDR3 Double Data Rate memory speeds and has a more advanced clocking scheme where transmitted serial data is accompanied by a forwarded clock which can be used to simplify clock and data recovery.

The device which is being used to generate and terminate serialized command and data local to the memory devices is called an Advanced Memory Buffer (AMB). Like in FBDIMM, there exist two generations of AMB where the first generation is referred to as AMB1 and the second generation is referred to as AMB2, and they are used in FBDIMM1 and FBDIMM2 respectively.

In the case of AMB1, all devices in the system are provided with a reference clock that is twenty four (24) times lower in frequency then the data rate supported by the high-speed serial links in the system. Serial interfaces on the AMB are expected to generate high-speed clocks locally to recover data reliably via localized clock and data recovery in each serial data path. Through very tightly controlled PLL (Phase Locked Loop) bandwidth specifications in all the devices in the system, jitter budgets can be roughly controlled and local clock and data recovery blocks within the devices can function properly.

In the second generation of AMB, the AMB2 is required to support significantly higher memory speeds and serial data rates than the AMB1. However, there is still an overlap in some of the speeds which are due to the fact that there is overlap in the speed supported by the respective DDR2 and DDR3 memories. A mechanism to improve jitter budgets was required in AMB2, and the resulting architecture requires that all devices in the system are provided a reference clock that is twenty four (24) times lower in frequency than the data rate supported by the high-speed serial links, just as in the AMB1. However, each AMB2 device is also required to forward, coupled with a set of high-speed serial data, a forwarded clock that is only 2 times lower in frequency than the data rate. This forwarded clock should be generated from the same PLL that is used to clock the output data, and hence have a very similar spectral profile as the data. This important property can be used to relax local clock data recovery (CDR) performance specifications, and can be used to significantly reduce AMB power.

Typically, a single generation of AMB would only be required to support a single clocking scheme, since AMB1 would support DDR2 memory, and AMB2 would support DDR3 memory. However, since there is overlap in the existence of DDR2 and DDR3 memory in the market, it is highly desirable to develop a device that can support both DDR2 and DDR3 memories, thus increasing product volume and driving down product cost. Additionally, if this new class of hybrid AMB could also interface with first generation host controllers as well as second generation host controllers, this ultimate AMB would have the broadest market coverage, highest volume, and potentially the broadest customer acceptance.

SUMMARY OF THE INVENTION

Therefore there is an object of the invention to provide an improved multiple reference phase locked loop, which would avoid or mitigate disadvantages of the prior art.

According to one aspect of the invention, there is provided a multi reference phase locked loop (MPLL) for generating a high speed clock having a high speed clock frequency and phase locking it to a lowest common reference frequency derived from a selected one of at least two reference clocks, the MPLL comprising:
  (a) a prescaler for reducing frequency of at least one of said at least two reference clocks;
  (b) a reference selector for selecting the selected one of said at least two reference clocks after its frequency has been reduced in the reference selector to the lowest common reference frequency;
  (c) a phase detector for comparing the selected one of the at least two reference clocks with a feedback clock, and generating a frequency control voltage indicative of a phase error between the compared clocks;
  (d) a voltage controlled oscillator (VCO) for generating the high speed clock having the high speed clock frequency based on the frequency control voltage until phase locking is indicated by a convergence of the phase error to a substantially constant value; and
  (e) a feedback divider for processing the high speed clock into the feedback clock with the same lowest common reference frequency.

In the embodiment of the invention, one of the reference clocks is a forwarded clock, and another of the reference clocks is a system reference clock.

The prescaler comprises:
  a first multiplexer for multiplexing the high speed clock and the at least two reference clocks into a multiplexed clock; and
  a divider circuit for reducing frequency of the multiplexed clock.

The first multiplexer is controlled by a control signal enabling a selection of the forwarded clock.

Alternatively, the first multiplexer may be controlled by a control signal enabling a selection of the high speed clock.

The MPLL further comprises a divider circuit for further reducing the frequency of the multiplexed clock to the lowest common reference frequency.

In the MPLL described above, the reference selector further comprises a second multiplexer for selecting the selected one of the at least two reference clocks.

The MPLL further comprises a clock detector for determining a presence of the forwarded clock.

The MPLL further comprises a fail safe logic circuit for controlling the second multiplexer to select the forwarded clock only when its presence is indicated by the clock detector.

The MPLL further comprises:
   a digital to analog converter for generating a programmable frequency control voltage; and
   an analog multiplexer for alternatively selecting the frequency control voltage and the programmable frequency control voltage to drive the VCO.

In the MPLL described above, the feedback divider comprises a plurality of clock dividers for generating clocks, one of which being the feedback clock.

According to another aspect of the invention, there is provided a method for generating a high speed clock having a high speed clock frequency and phase locking it to a lowest common reference frequency derived from a selected one of at least two reference clocks, the method comprising:
   (a) reducing frequency of at least one of said at least two reference clocks;
   (b) selecting the selected one of said at least two reference clocks after its frequency has been reduced to the lowest common reference frequency;
   (c) comparing the selected one of the at least two reference clocks with a feedback clock, and generating a frequency control voltage indicative of a phase error between the compared clocks;
   (d) generating the high speed clock having the high speed clock frequency based on the frequency control voltage until phase locking is indicated by a convergence of the phase error to a substantially constant value; and
   (e) processing the high speed clock into the feedback clock with the same lowest common reference frequency.

In the method described above, one of the reference clocks is a forwarded clock, and another of the reference clocks is a system reference clock.

The step (a) of the method comprises:
multiplexing the high speed clock and the at least two reference clocks into a multiplexed clock; and
reducing a frequency of the multiplexed clock.

Conveniently, the step of multiplexing comprises enabling a selection of the forwarded clock.

Alternatively, the step of multiplexing may comprise enabling a selection of the high speed clock.

The method further comprises reducing the frequency of the multiplexed clock to the lowest common reference frequency.

Conveniently, the step of multiplexing further comprises selecting the selected one of the at least two reference clocks, or determining a presence of the forwarded clock in a clock detector. The step of multiplexing further comprises selecting the forwarded clock only when its presence is indicated by the clock detector.

The method further comprises:
generating a programmable frequency control voltage; and
alternatively selecting the frequency control voltage and the programmable frequency control voltage for driving a voltage controlled oscillator (VCO).

The method further comprises generating clock signals in a plurality of clock dividers, one of the clock signals being the feedback clock.

Thus, an improved multiple reference phase locked loop (MPLL) according to the embodiments of the invention has been provided.

BRIEF DESCRIPTION OF THE DRAWINGS

An embodiment of the invention will now be described by way of example only with reference to the appended drawings, wherein.

DETAILED DESCRIPTION OF THE EMBODIMENTS

It would be advantageous for a single AMB device to be able to simultaneously support two generations of DRAM devices, and two generations of host controller. This is particularly valuable considering that there is overlap in the operating frequencies of the aforementioned DRAM technologies. To enable this type of flexibility, a multi reference PLL clocking scheme is proposed in the embodiments of the present invention, which is able to operate with or without a forwarded clock without requiring a design change in the high-speed serial links. Furthermore, even in a system that uses forwarded clocks, it is mandatory for the multi reference PLL to continue functioning in the absence of a forwarded clock. This means that the multi reference PLL should be able to switch from using a forwarded clock to a reference clock automatically until a forwarded clock is restored.

The embodiments of the present invention are concerned with developing a multi reference PLL, which can provide the overlap in the operating frequencies of the aforementioned DRAM technologies. To enable this type of flexibility, a multi reference PLL clocking scheme should be able to operate with or without a forwarded clock without requiring a design change in the high-speed serial links.

Requirements for the earlier version of FBDIMMs (FB-DIMM1) including AMBs (AMB1s) are described in detail in a proposed JEDEC (Joint Electrical Device Engineering Council) Standard entitled "FB-DIMM Draft Specification", jointly published in March 2005 by the JEDEC Solid State Technology Association, and EIA (Electrical Industries Alliance) and "FB-DIMM High Speed Differential PTP Link at 1.5V—Specification", JEDEC, September 2006.

Figure 1:
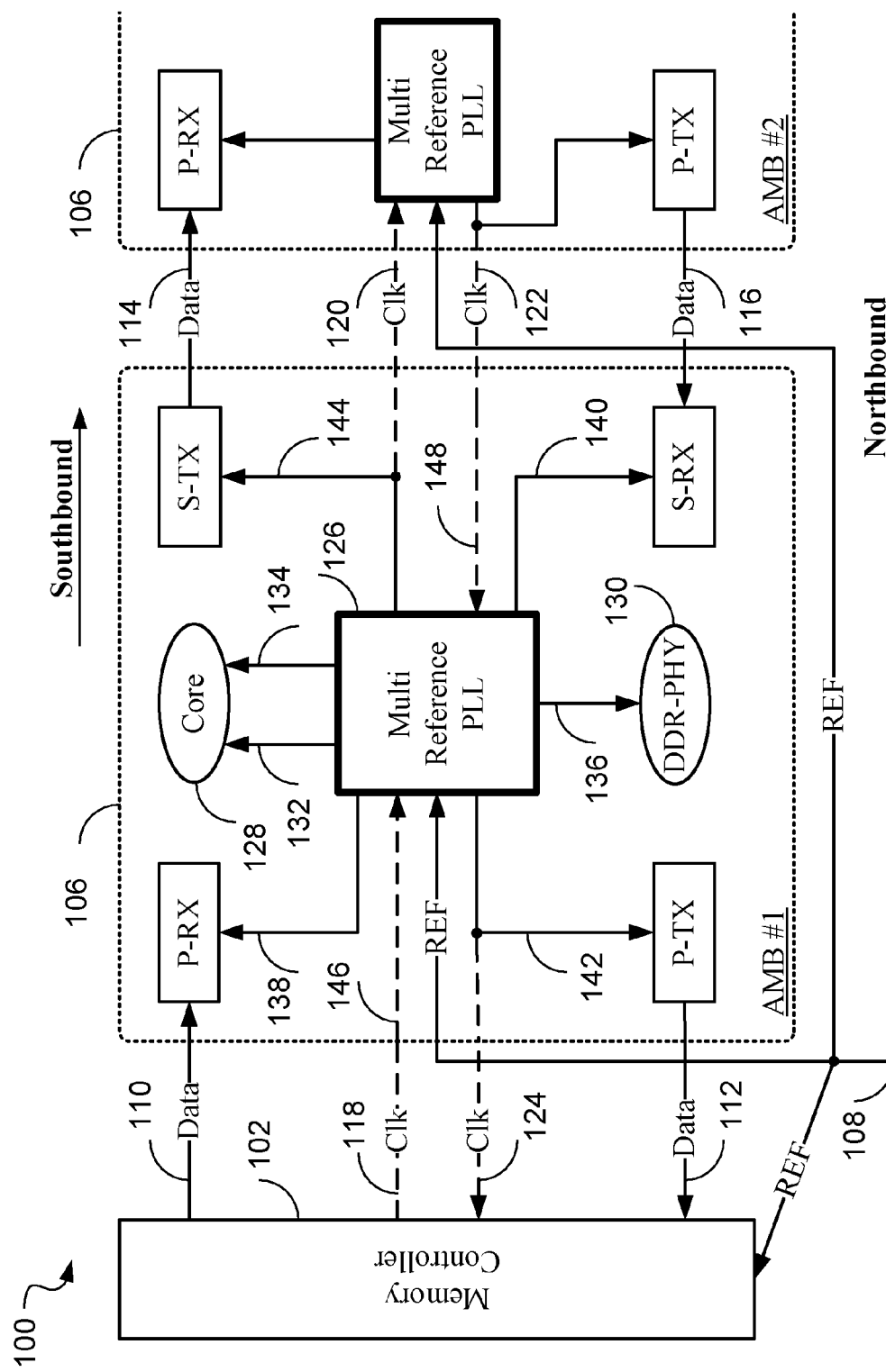
FIG. 1 shows a partial block diagram of a generic FBDIMM based memory system 100 to illustrate a clocking scheme according to an embodiment of the invention.

FIG. 1 shows a partial block diagram of a generic FBDIMM based memory system 100 to illustrate a clocking scheme according to an embodiment of the invention. The FBDIMM based memory system 100 comprises a memory controller 102, a clock generator 104, and one or more multi-generation advanced memory buffers (AMB) 106, including a first AMB labeled AMB#1. The FBDIMM based memory system 100 may include additional AMBs 106, only a second such AMB being shown in FIG. 1 labeled AMB#2. Each multi-generation AMB 106 may be associated with an FBDIMM1 or FBDIMM2 and run in AMB1 mode or AMB2 mode to realize the functions of an AMB1 or an AMB2 accordingly.

The memory controller 102 and the AMBs 106 receive a common system reference clock (REF) 108 from the clock generator 104.

The memory controller 102 and the AMBs 106 of the FBDIMM based memory system 100 are arranged in a bidirectional daisy chain. In this daisy chain configuration, the direction away from the memory controller 102 is commonly referred to as a "southbound" direction, and the direction towards the memory controller 102 as a "northbound" direction. The two sides of the AMB 106, facing towards the memory controller 102 and facing away from it are also referred to as "primary" and "secondary" sides respectively. Signals within the AMB 106 on each side will be referred to as primary and secondary forwarded signals.

In the "southbound" direction, the memory controller 102 is connected to the AMB#1 with a southbound data signal 110. In the "northbound" direction, a northbound data signal 112 is sent from the AMB#1 to the memory controller 102.

The southbound data signal 110 is regenerated in the AMB#1 and passed to the AMB#2 as a forwarded data signal 114. The AMB#2 in turn may regenerate the forwarded data signal 114 for the next AMB in the chain. Similarly, a northbound data signal 116 may be received by the AMB#1 from the AMB#2 to be regenerated in the AMB#1 and transmitted to the memory controller 102 as the forwarded northbound data signal 112.

In the AMB2 mode, clock signals are also regenerated and forwarded by the AMB 106. Consequently the illustration of the generic FBDIMM based memory system 100 also includes forwarded clocks including a southbound primary side clock 118 sent from the memory controller 102 to the first AMB 106 (AMB#1), and forwarded as a forwarded clock 120 to the AMB#2. Similarly, a northbound clock 122 that may be received from the AMB#2 to be regenerated by the AMB#1 and forwarded as a northbound clock 124 from the first AMB 106 (AMB#1) to the memory controller 102.

The forwarded clocks would only be required in an FBDIMM2 system using the AMB2 mode of the AMB 106, and are therefore illustrated with dashed lines in FIG. 1.

The AMB 106 includes data forwarding receive and transmit circuits: a primary receive circuit P-RX, a primary transmit circuit P-TX, a secondary receive circuit S-RX, and a secondary transmit circuit S-TX. The AMB 106 further includes a multi reference PLL (MPLL) 126, a digital core logic 128, and a DDR memory interface circuit (DDR-PHY) 130.

The southbound data signal 110 is received in the AMB 106 in the primary receive circuit P-RX, regenerated and forwarded as the forwarded data signal 114 from the secondary transmit circuit S-TX. Similarly, the northbound data signal 116 is received in the AMB 106 in the secondary receive circuit S-RX, regenerated and forwarded as the forwarded northbound data signal 112 from the primary transmit circuit P-TX.

It is noted that the AMB 106 has many features relating to the forwarding of data between the Memory Controller 102, actual DDR memory devices on the FBDIMM, and the daisy chain of AMBs. Some of these features have been described in previous applications of the applicant Ser. No. 11/790,707 "PROGRAMMABLE ASYNCHRONOUS FIRST-IN-FIRST-OUT (FIFO) STRUCTURE WITH MERGING CAPABILITY" to Reitlingshoefer et al. filed Apr. 27, 2007; Ser. No. 11/984,852 "A VOLTAGE CONTROLLED OSCILLATOR (VCO) WITH A WIDE TUNING RANGE AND SUBSTANTIALLY CONSTANT VOLTAGE SWING OVER THE TUNING RANGE" to Pfaff, Dirk filed Nov 23, 2007; and Ser. No. 12/081,380 "IMPROVED LINEAR PHASE INTERPOLATOR AND PHASE DETECTOR" to Yosefi Moghaddam filed Apr. 15, 2008, all of which are incorporated herein by reference.

The embodiments of the present invention are not concerned in detail with the data path in the AMB 106, instead focusing on the clocking scheme, which includes generating required clocks with the MPLL 126, and distributing them. To this end, the multi reference PLL 126 is designed to be synchronized to any of a number of clock reference inputs, and generate required clock signals for both AMB1 and AMB2 modes.

As indicated, FIG. 1 illustrates the clocking scheme of a general FBDIMM system. It is noted that forwarded clocks (shown with dashed lines) are available only in FBDIMM2 systems. In FBDIMM1 systems, the AMB 106 is clocked by the system reference clock 108 (REF) delivered by the memory sub-system central clock generator. In an FBDIMM2 configuration, the AMB 106 is normally clocked by the primary side forwarded clock 118, however, the system reference clock 108 is still available. Consequently, the multi reference PLLs 126 in the various AMBs are in a daisy chain configuration in FBDIMM2 systems, wherein the multi reference PLL 126 in any AMB 106 receives its reference from the multi reference PLL 126 residing in the adjacent AMB 106 closer towards the memory controller 102, i.e. from the primary side forwarded clock 118. In such a configuration, the system reference clock 108 is typically used only in case of a failure of the forwarded clock. It is noted that the FBDIMM2 supports an automatic fail-over of forwarded clocks which requires the MPLL 126 to detect such failure, and then take synchronization from the system reference clock 108.

The MPLL 126 provides several modes of operation to accommodate both FBDIMM1 and FBDIMM2 clocking schemes. Other modes of operation of the MPLL 126 may provide clocking schemes beyond the FBDIMM1 and FBDIMM2 standards, for example a bypass clocking mode, and a hybrid clocking mode to allow mixing of FBDIMMs of both standards in the same system.

Independent of the mode of operation, the MPLL 126 provides, in general, seven different clocks. Certain modes of operation provide only a subset of these clocks, e.g. a transparent clocking mode and a power-down mode. The frequency of all clocks is equal to fixed integer multiples, or harmonic multiples, of the frequency of the system reference clock REF. The frequency ratios are independent of the mode of operation, however, the way in which the clocks are synthesized may differ, e.g. receive clocks are generated by means of direct synthesis from forwarded clocks in an FBDIMM2clocking mode, but the same clocks are generated by means of indirect synthesis from the system reference clock in an FBDIMM1clocking mode. As a result, the jitter properties of the clocks may vary between the different modes of operation.

The clocks generated and output by the multi reference PLL 126 are:
- a repeated reference clock CCK333M 132;
- a core clock CCK667M 134;
- a DDR-PHY clock CCK1333M 136;
- a primary receive clock PRCK2G 138;
- a secondary receive clock SRCK2G 140;
- a primary transmit clock PTCK4G 142; and
- a secondary transmit clock STCK4G 144.

The repeated reference clock CCK333M 132 is a CMOS replica of the system reference clock 108. This repeated reference clock CCK333M 132 is connected to the digital core logic 128 and used by it during start-up when the MPLL 126 is not yet properly configured and other clocks are not available.

The core clock CCK667M 134 is also connected to the digital core logic 128. It has a frequency that is twice the frequency of the system reference clock 108, with a 50% duty cycle clock typically guaranteed by design.

The DDR-PHY clock CCK1333M 136 is connected to the DDR memory interface circuit (DDR-PHY) 130. Its frequency is four times the frequency of the system reference clock 108, with a duty cycle that is generally, by design, equal to 33%.

The primary receive clock PRCK2G 138 and the secondary receive clock SRCK2G 140 are connected to the primary and secondary receive circuits P-RX and S-RX respectively. These clocks are used to sample the serial southbound and northbound data signals 110 and 116 respectively. The frequency of these clocks is six times the frequency of the system reference clock 108, and thus equal to one quarter of the high-speed serial data baud-rate. A 50% duty cycle is typically guaranteed by design.

The primary transmit clock PTCK4G 142 and the secondary transmit clock STCK4G 144 are connected to the primary and secondary transmit circuits P-TX and S-TX respectively. These clocks are used for transmitting the forwarded northbound and southbound data signals 112 and 114 respectively. The frequency of these clocks is twelve times the frequency of the system reference clock 108 that is one half of the high-speed serial data baud-rate. In the FBDIMM2clocking scheme, the primary transmit clock PTCK4G 142 and the secondary transmit clock STCK4G 144 are also forwarded to the neighboring AMBs 106 as the forwarded clock 120 and the northbound clock 124 in the daisy chain; in the case of the first AMB 106 (AMB#1), the primary transmit clock PTCK4G 142 is forwarded to the memory controller 104 as the northbound clock 124.

The names of these seven clocks are designed to indicate their use and nominal frequency, for example the Primary Transmit ClocK PTCK4G whose nominal frequency is 4 GHz, even though (as will be described below) the clock frequencies are scaled to the system reference clock 108 and may be adjusted over a certain range.

Within the AMB 106, the southbound primary side clock 118 and northbound clock 122 are also referred to as a primary forwarded clock PFWCK4G 146 and a secondary forwarded clock SFWCK4G 148 respectively.

The large range of clock frequencies generated by the MPLL 126, combined with the fact that some clocks are distributed throughout the AMB device, i.e. over a distance of several millimeters, requires different electrical signaling. The lower-speed clocks, i.e. the repeated reference clock CCK333M 132 and the core clock CCK667M 134, are delivered to the digital core logic 128 in the form of standard CMOS clock signals. The higher speed clocks, i.e. the DDR-PHY clock CCK1333M 136, the primary and secondary receive clocks PRCK2G 138 and SRCK2G 140, and the primary and secondary transmit clocks PTCK4G 142 and STCK4G 144 are driven differentially.

Figure 2:
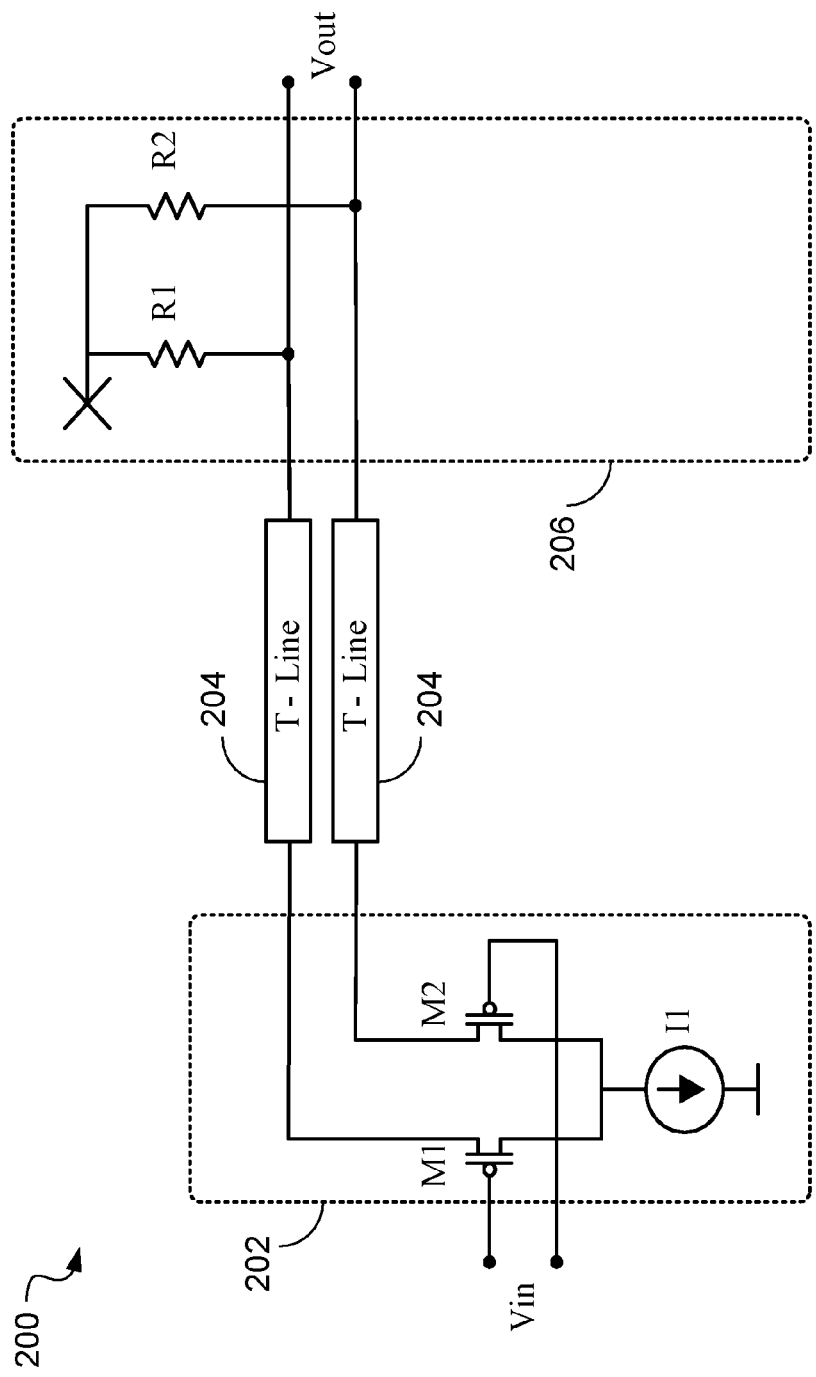
FIG. 2 shows a high speed clock transmission arrangement 200 that may be used to couple any of the higher speed clocks from the MPLL 126 of FIG. 1 to the respective users of the clocks.

FIG. 2 shows a high speed clock transmission arrangement 200 that may be used to couple any of the higher speed clocks from the MPLL 126 to the respective users of the clocks. The high speed clock transmission arrangement 200 comprises a differential current mode driver 202, two differential on-chip transmission lines 204 and a differential clock receiver 206, the differential on-chip transmission lines 204 being coupled between the differential current mode driver 202 and the differential clock receiver 206. The differential current mode driver 202 comprising transistors T1 and T2, and a current source I1, converts a differential input voltage Vin into a differential current and injects the differential current into the differential on-chip transmission lines 204. At the differential clock receiver 206, the current is converted by resistors R1 and R2 into a differential voltage Vout.

The signaling concept shown in FIG. 2 is also used in receiving the forwarded clocks, that is the southbound primary side clock 118 and the northbound clock 122 where the MPLL 126 provides the differential clock receiver 206, the differential current mode driver 202 being located in the memory controller 102 or the neighboring AMB 106 (AMB#2) respectively. Reception of the system reference clock 108 may typically require a High-speed Current Steering Logic (HCSL) receiver, which converts the (off-chip) differential system reference clock signal into a CMOS clock signal.

The input and output clocks of the MPLL 126 are tabulated in Tables 1 and 2 below. Each table lists for each clock: the name of the clock signal; a brief description; the clock period expressed in multiples of high-speed link unit intervals (UI); the ratio by which the frequency is related to the frequency of the system reference clock 108 (f/fREFCK333M); and the electrical signaling method.

TABLE 1

| MPLL input clocks | | | | |
|---|---|---|---|---|
| Clock Signal | Description | Clock Period | $f/f_{REFCK333M}$ | Signalling Method |
| PFWCK4G | Forwarded clock, primary side | 2UI | 12 | Current mode |
| SFWCK4G | Forwarded clock, secondary side | 2UI | 12 | Current mode |
| REFCK333M | System reference clock | 24UI | 1 | HCSL |

TABLE 2

MPLL output clock

| Clock Signal | Description | Clock Period | f/f$_{REFCK333M}$ | Signalling Method |
|---|---|---|---|---|
| PRCK2G | Master receive clock, primary side | 4UI | 6 | Current mode |
| SRCK2G | Master receive clock, secondary side | 4UI | 6 | Current mode |
| PTCK4G | Master transmit clock, primary side | 2UI | 12 | Current mode |
| STCK4G | Master transmit clock, secondary side | 2UI | 12 | Current mode |
| CCK1333M | DDR clock | 6UI | 4 | Current mode |
| CCK667M | Core clock | 12UI | 2 | CMOS |
| CCK333M | System Reference clock | 24UI | 1 | CMOS |

Figure 3:
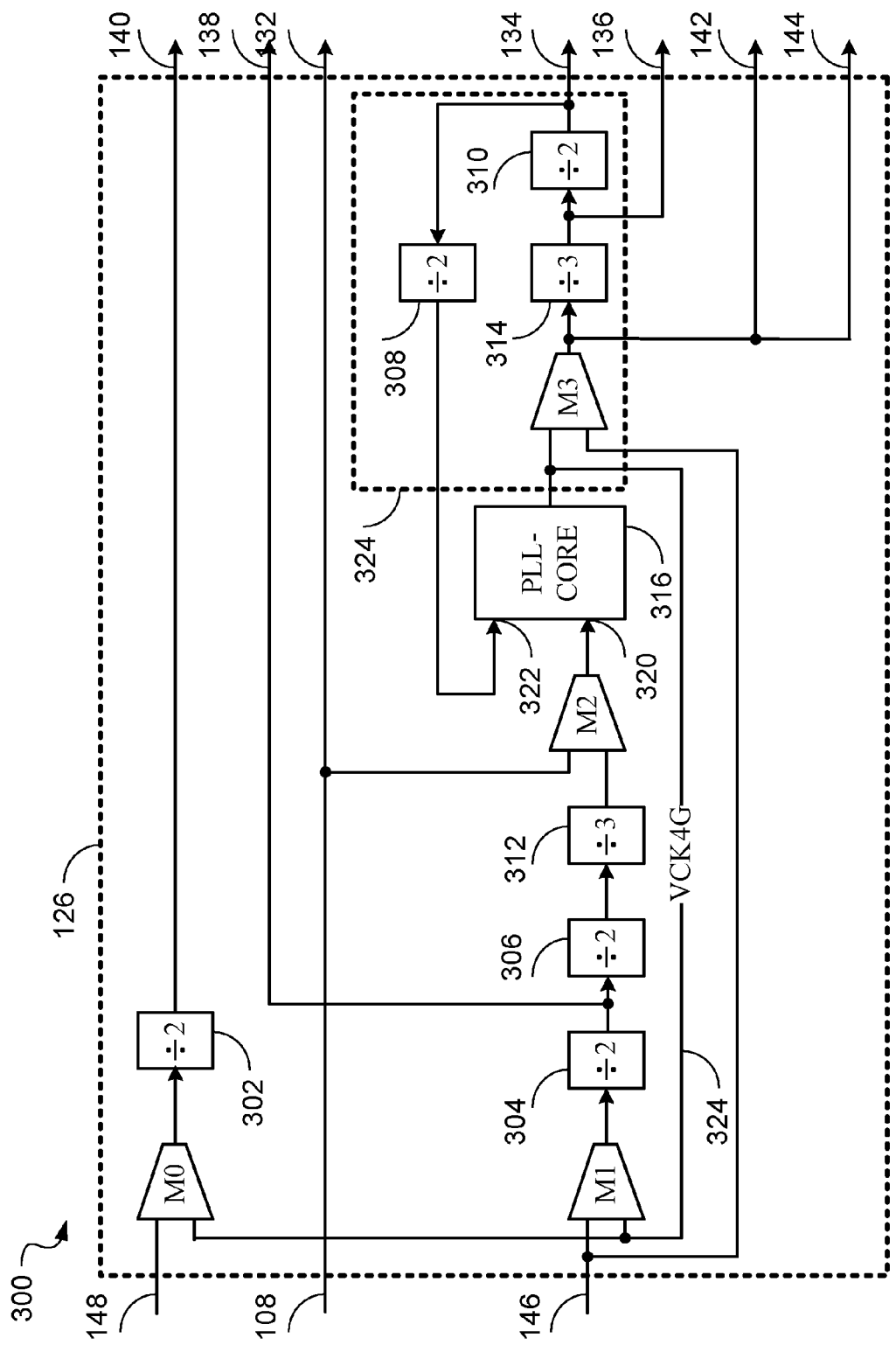
FIG. 3 shows a simplified block diagram 300 of the MPLL 126 of FIG. 1 illustrating the principle of operation.

FIG. 3 shows a simplified block diagram 300 of the MPLL 126 illustrating the principle of operation. Input clocks to the MPLL 126, shown on the left side of the figure, comprise:

the system reference clock 108;
the secondary forwarded clock SFWCK4G 148; and
the primary forwarded clock PFWCK4G 146.

Output clocks from the MPLL 126, shown on the right side of the figure, comprise:

the repeated reference clock CCK333M 132;
the core clock CCK667M 134;
the DDR-PHY clock CCK1333M 136;
the primary receive clock PRCK2G 138;
the secondary receive clock SRCK2G 140;
the primary transmit clock PTCK4G 142; and
the secondary transmit clock STCK4G 144.

The simplified block diagram 300 of the MPLL 126 is shown here to illustrate the generation of the output clocks in terms of the frequency management. The MPLL 126 includes: four 2:1 multiplexers M0, M1, M2, and M3; a number of clock dividers, that is divide-by-two blocks 302, 304, 306, 308, and 310, and two divide-by-three blocks 312 and 314; and a PLL-Core 316 with an output, a reference input 320, and a feed back input 322. These blocks are connected to each other and to the input and output clocks as follows:

The secondary forwarded clock SFWCK4G 148 and a high-speed VCO clock VCK4G 324 from the output of the PLL-Core 316 are coupled to the inputs of the multiplexer M0. The output of the multiplexer M0 is coupled to the input of the divide-by-two block 302 whose output is coupled to the secondary receive clock SRCK2G 140.

The primary forwarded clock PFWCK4G 146 and the high-speed VCO clock VCK4G 324 are coupled to the inputs of the multiplexer M1. The output of the multiplexer M1 is coupled to the input of the divide-by-two block 304 whose output is coupled to the primary receive clock PRCK2G 138 as well as to the input of the divide-by-two block 306.

The output of the divide-by-two block 306 is coupled to the input of the divide-by-three block 312.

The system reference clock 108 and the output of the divide-by-three block 312 are coupled to the inputs of the multiplexer M2. The system reference clock 108 is also coupled to the repeated reference clock CCK333M 132.

The output of the PLL-Core 316 and the primary forwarded clock PFWCK4G 146 are further coupled to the inputs of the multiplexer M3 whose output is coupled to the input of the divide-by-three block 314 as well as to the primary and secondary transmit clocks PTCK4G 142 and STCK4G 144 respectively.

The output of the divide-by-three block 314 is coupled to the input of the divide-by-two block 310 as well as to the DDR-PHY clock CCK1333M 136. The output of the divide-by-two block 310 is coupled to the input of the divide-by-two block 308 as well as to the core clock CCK667M 134. The output of the divide-by-two block 308 is coupled to the feed back input 322 of the PLL-Core 316.

The PLL-Core 316 may include a phase detector, a Voltage Controlled Oscillator, and other elements commonly used in a PLL, but are lacking a feedback path within the PLL-Core 316. The feedback path is provided by a block 324 of other components of the MPLL 216. The block 324 includes the multiplexer M3 and the clock dividers 308, 310, and 314. An implementation of the PLL-Core 316 according to an embodiment of the invention is described in more detail in FIG. 11 below.

In the following figures (FIG. 4 to FIG. 10), seven clocking modes of operation for the MPLL 126 are described. It should be noted that the MPLL 126 shown in FIG. 3 can accommodate all seven clocking modes described below. Each of the following figures is derived from FIG. 3 by showing the clock paths that are activated in thick lines. Circuit blocks that are in use in any particular one of the clocking modes are also shown in thick outline in these figures. All unused circuit blocks may be powered down in the actual implementation of the MPLL 126.

Figure 4:
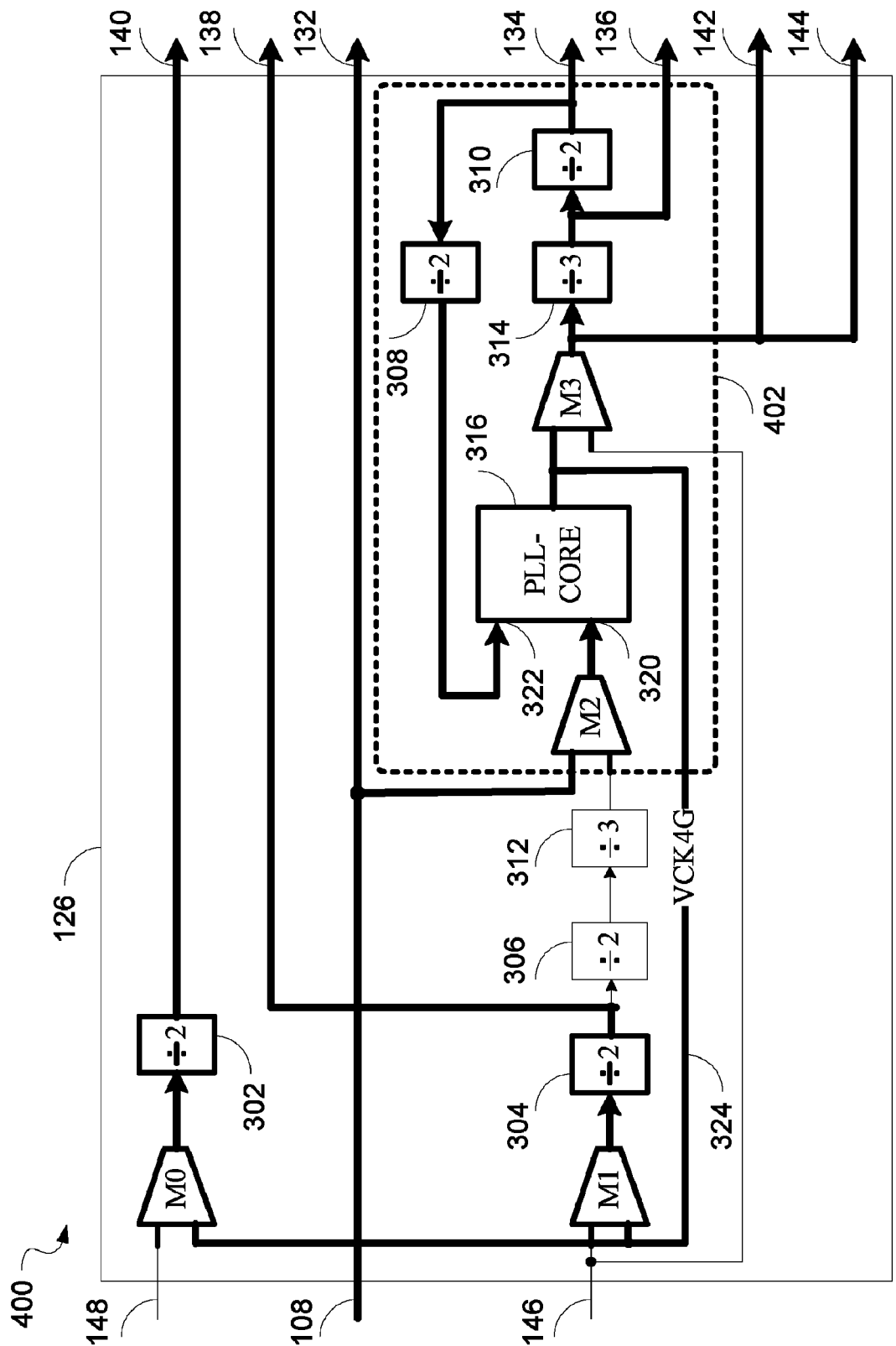
FIG. 4 shows the MPLL 126 of FIG. 3 in an AMB1 clocking mode 400.

FIG. 4 shows the MPLL 126 in an AMB1 clocking mode 400. In the AMB1 clocking mode 400, the secondary forwarded clock SFWCK4G 148 and the primary forwarded clock PFWCK4G 146 are ignored (they are not available in an AMB1). A fully functional PLL 402 is formed around the PLL-Core 316, with system reference clock 108 connected through the multiplexer M2 to the reference input 320, and a feedback path from the output of the PLL-Core 316 through the multiplexer M3 and the chain of divide-by-two/three blocks 314, 310, 308. The PLL 402 is phase locked to the system reference clock 108 and indirectly synthesizes all output clocks except the repeated reference clock CCK333M 132 which is the same as the system reference clock 108.

Figure 5:
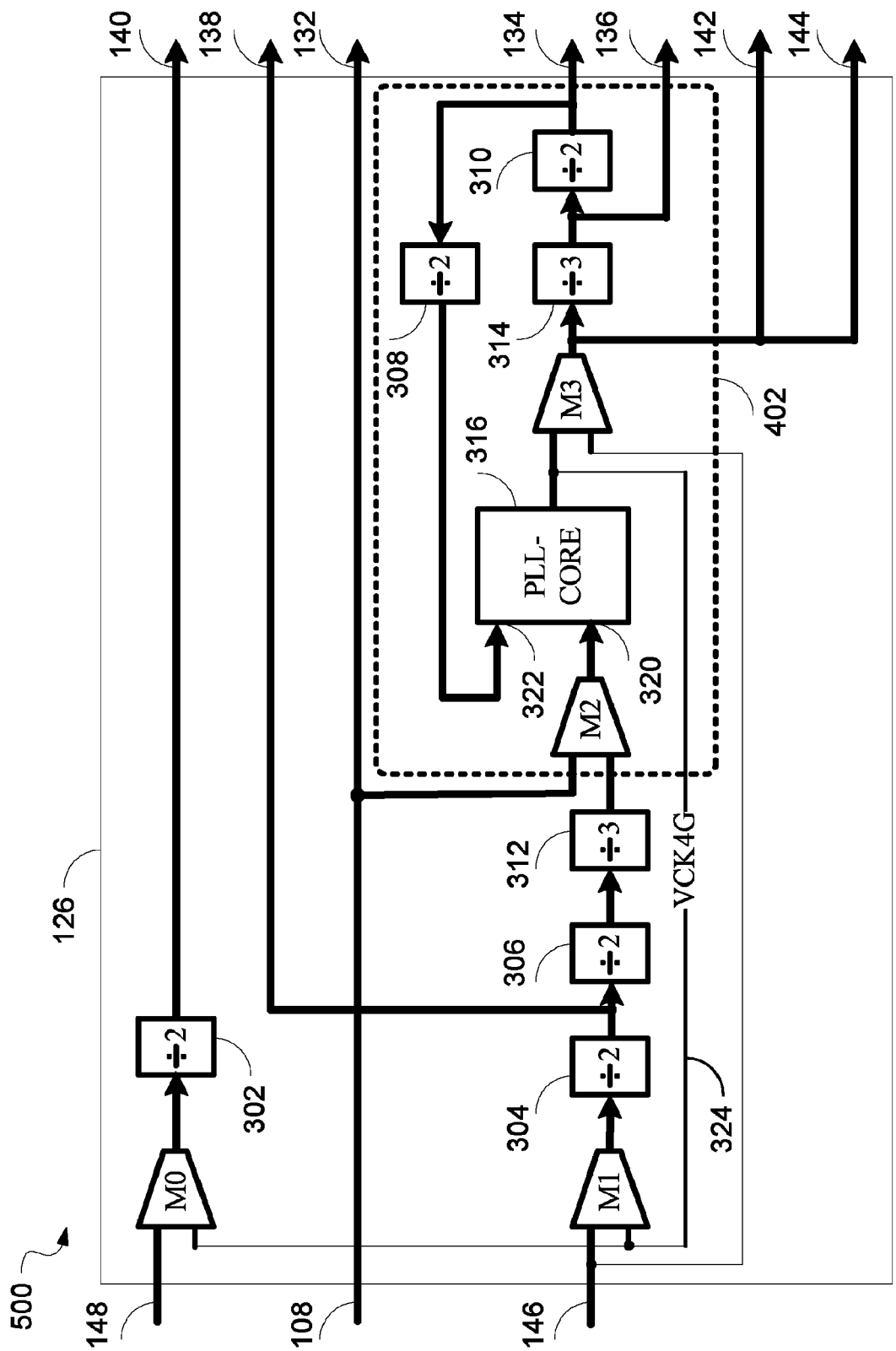
FIG. 5 shows the MPLL 126 of FIG. 3 in an AMB2 clocking mode 500.

FIG. 5 shows the MPLL 126 in an AMB2 clocking mode 500. In the AMB2mode, the primary receive clock PRCK2G 138 is directly derived from the primary forwarded clock PFWCK4G 146 through the multiplexer M1 and the divide-by-two block 304, and the secondary receive clock SRCK2G 140 is directly derived from the secondary forwarded clock SFWCK4G 148 through the multiplexer M0 and the divide-by-two block 302. The PLL 402 is phase locked either to the system reference clock 108 or to the primary forwarded clock PFWCK4G 146 (divided by 18 through the chain of divide-by-two/three blocks 304, 306, and 312, depending on the setting of the multiplexer M2 which functions as a reference selector. The PLL 402 indirectly synthesizes the core clock CCK667M 134, the DDR-PHY clock CCK1333M 136, the primary transmit clock PTCK4G 142, and the secondary transmit clock STCK4G 144.

Figure 6:
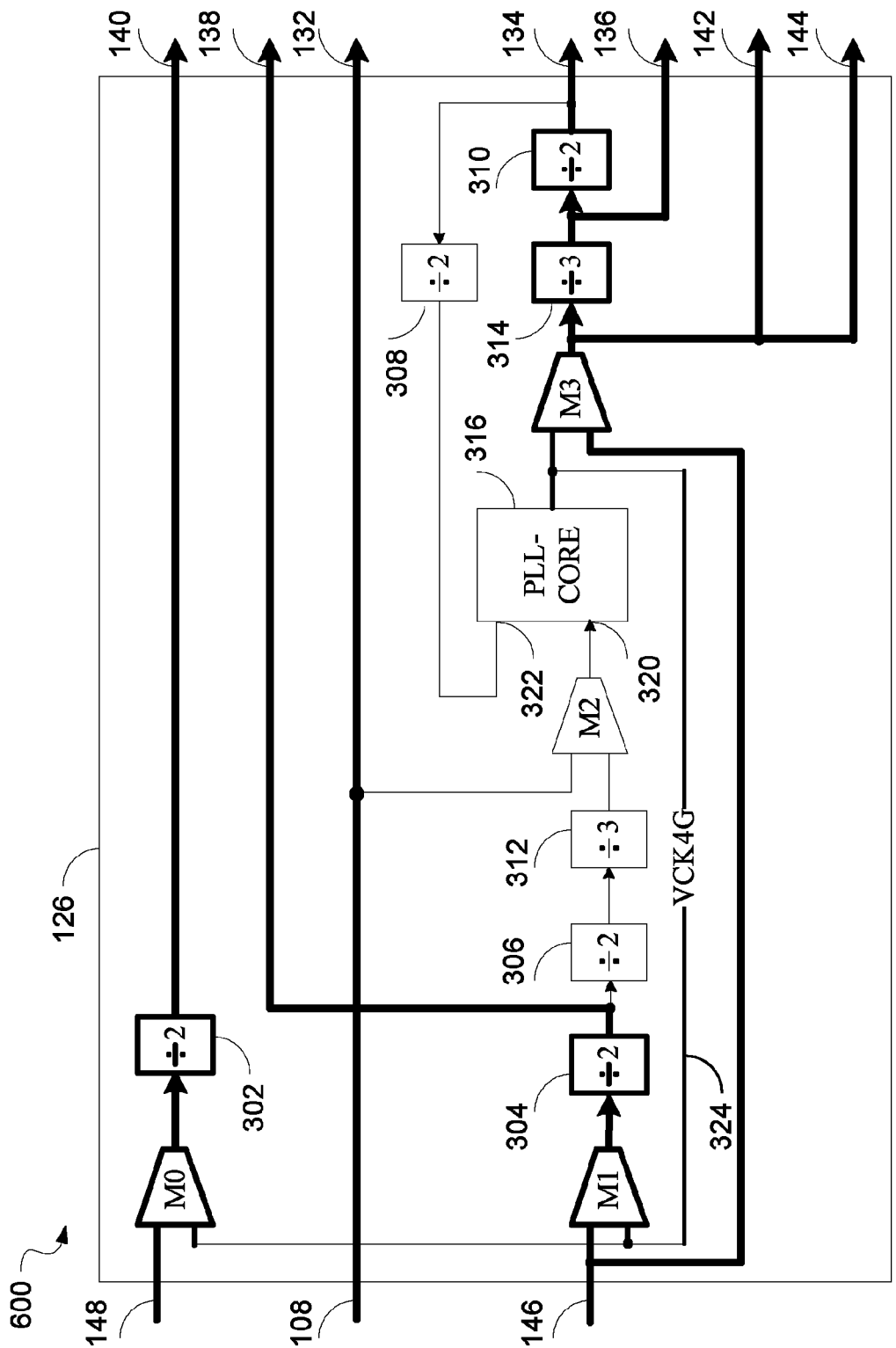
FIG. 6 shows the MPLL 126 of FIG. 3 in a bypass clocking mode 600.

FIG. 6 shows the MPLL 126 in a bypass clocking mode 600, in which the PLL-Core 316 is disabled. In the same way as in the AMB2 clocking mode 500 (FIG. 5), the primary and secondary receive clocks (PRCK2G 138 and SRCK2G 140) are directly derived from the primary and secondary forwarded clocks (PFWCK4G 146 and SFWCK4G 148) respectively. The core clock CCK667M 134, the DDR-PHY clock CCK1333M 136, the primary transmit clock PTCK4G 142, and the secondary transmit clock STCK4G 144 are directly derived from the primary forwarded clock PFWCK4G 146.

The bypass clocking mode 600 is typically used only for testing purposes. It allows speed margin tests of the frequency dividers as well as speed margin tests of the digital core logic 128.

Figure 7:
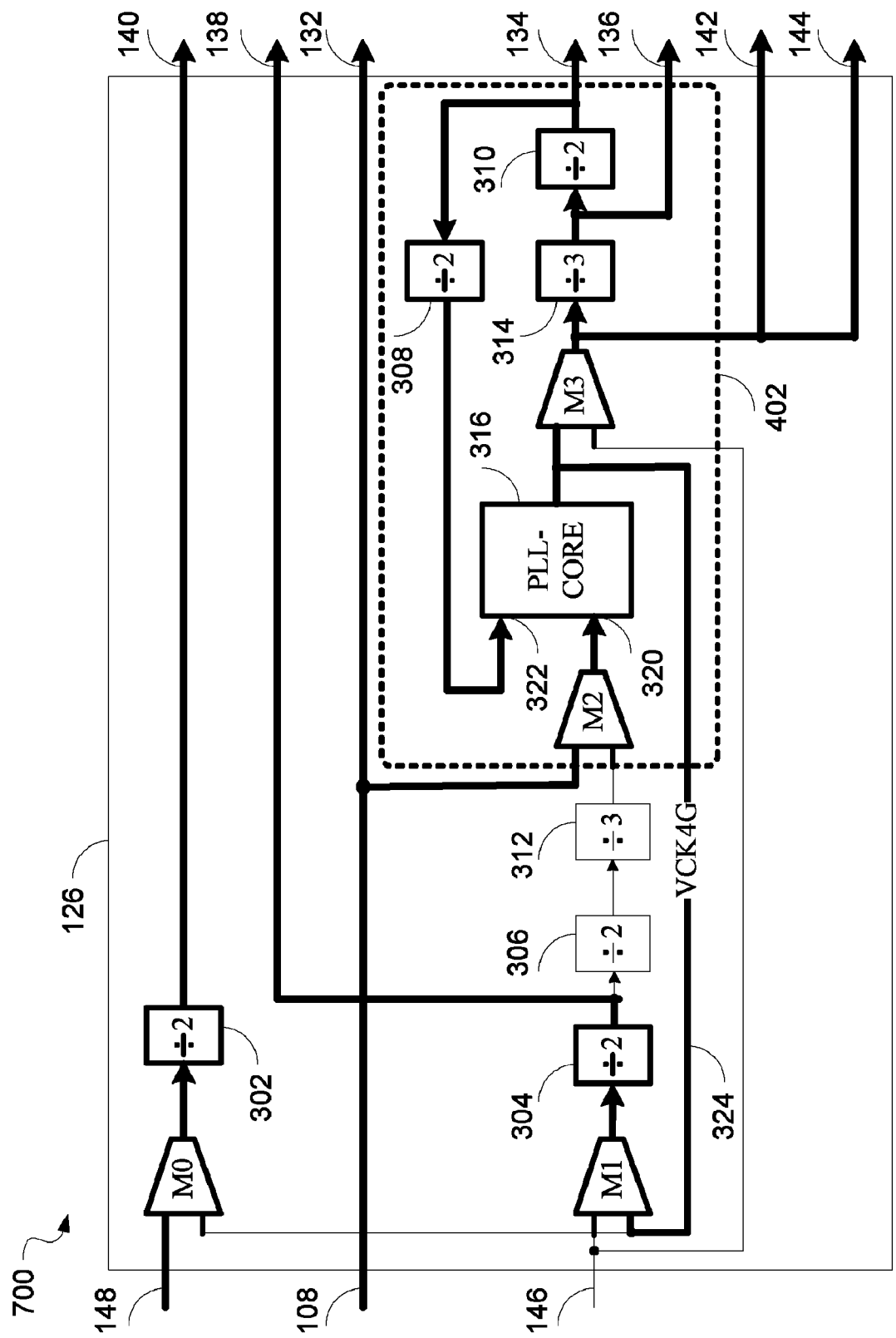
FIG. 7 shows the MPLL 126 of FIG. 3 in a hybrid clocking mode 700 which represents a mix between AMB1 and AMB2 clocking modes 400 and 500.

FIG. 7 shows the MPLL 126 in a hybrid clocking mode 700 which represents a mix between AMB1 and AMB2 clocking modes 400 and 500. Clocking on the primary side is identical to AMB1 clocking mode and clocking on the secondary side is identical to AMB2 clocking mode. Consequently, the secondary receive clock SRCK2G 140 is derived directly from the secondary forwarded clock SFWCK4G 148 through the multiplexer M0 and the divide-by-two block 302 (as in the AMB2 clocking mode 500), while the primary receive clock PRCK2G 138 is synthesized indirectly from the system reference clock 108 through the PLL 402 (as in the AMB1 clocking mode 400). The PLL 402 also indirectly synthesizes the core clock CCK667M 134, the DDR-PHY clock CCK1333M 136, the primary transmit clock PTCK4G 142, and the secondary transmit clock STCK4G 144.

The hybrid clocking mode 700 can be used to run an FBDIMM1system with forwarded clocks although the memory controller does not provide forwarded clocks. In such a configuration, the first AMB in the chain, using the hybrid clocking mode 700, generates a forwarded clock on its secondary side. The remaining AMBs are configured in the AMB2 clocking mode 500. As a result, forwarding of clocks can be tested without the presence of a FBDIMM2 memory controller.

Figure 8:
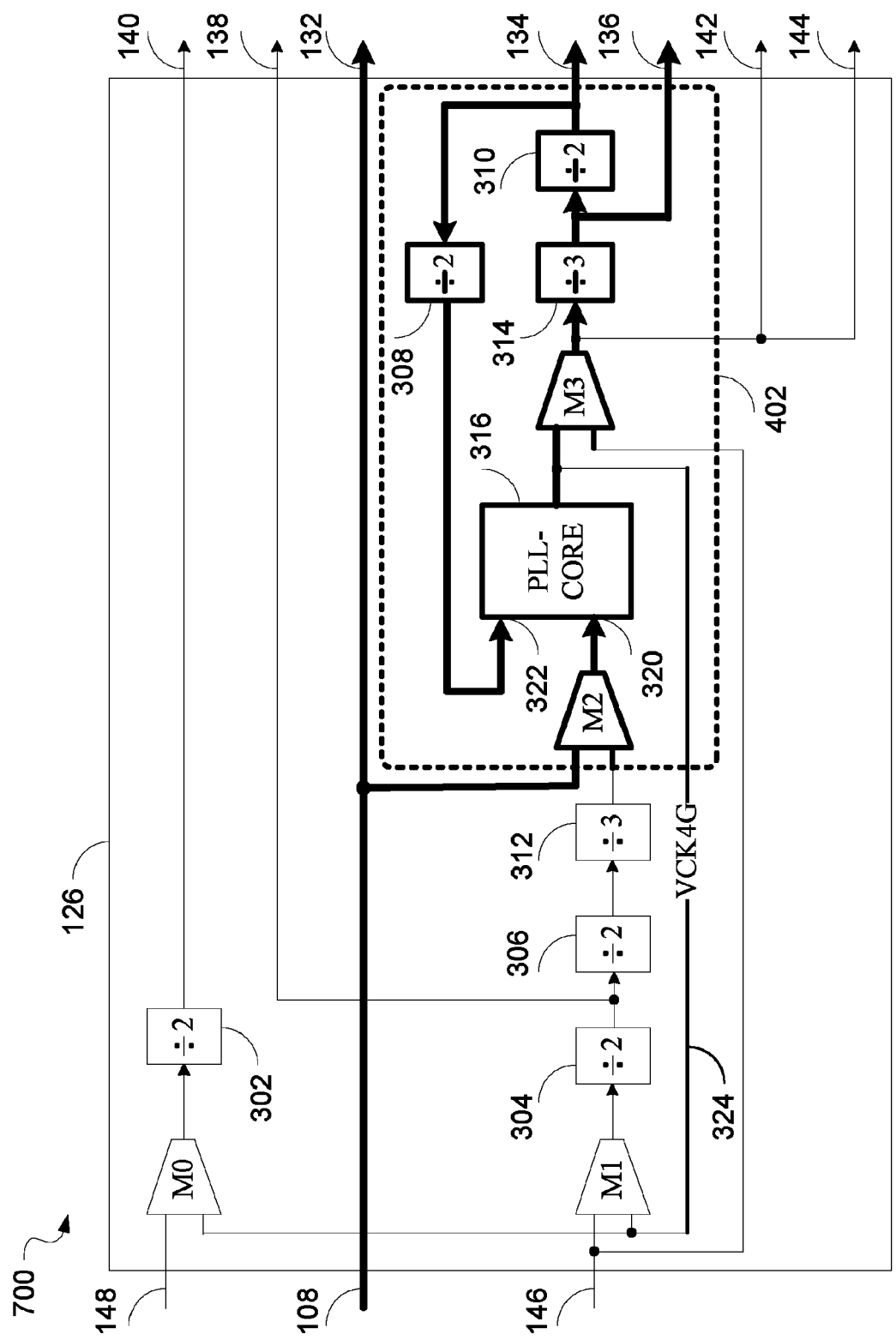
FIG. 8 shows the MPLL 126 of FIG. 3 in a transparent clocking mode 800.

FIG. 8 shows the MPLL 126 in a transparent clocking mode 800, in which only the repeated reference clock CCK333M 132, the core clock CCK667M 134, and the DDR-PHY clock CCK1333M 136 are generated. High frequency clocks (the primary receive clock PRCK2G 138, the secondary receive clock SRCK2G 140, the primary transmit clock PTCK4G 142, and the secondary transmit clock STCK4G 144) are kept 'quiet'. The core clock CCK667M 134, and the DDR-PHY clock CCK1333M 136 are indirectly synthesized from the PLL 402 which is phase locked to the system reference clock 108. The primary forwarded clock PFWCK4G 146 and the secondary forwarded clock SFWCK4G 148 are ignored.

It will be noted that in the transparent clocking mode 800 the high-frequency transmit side clocks (the primary transmit clock PTCK4G 142, and the secondary transmit clock STCK4G 144) are actually generated internally due to the used topology (compare with FIG. 3). Consequently, these clocks are disabled in the clock drivers (compare with the implementation view of the MPLL 126 described below).

Figure 9:
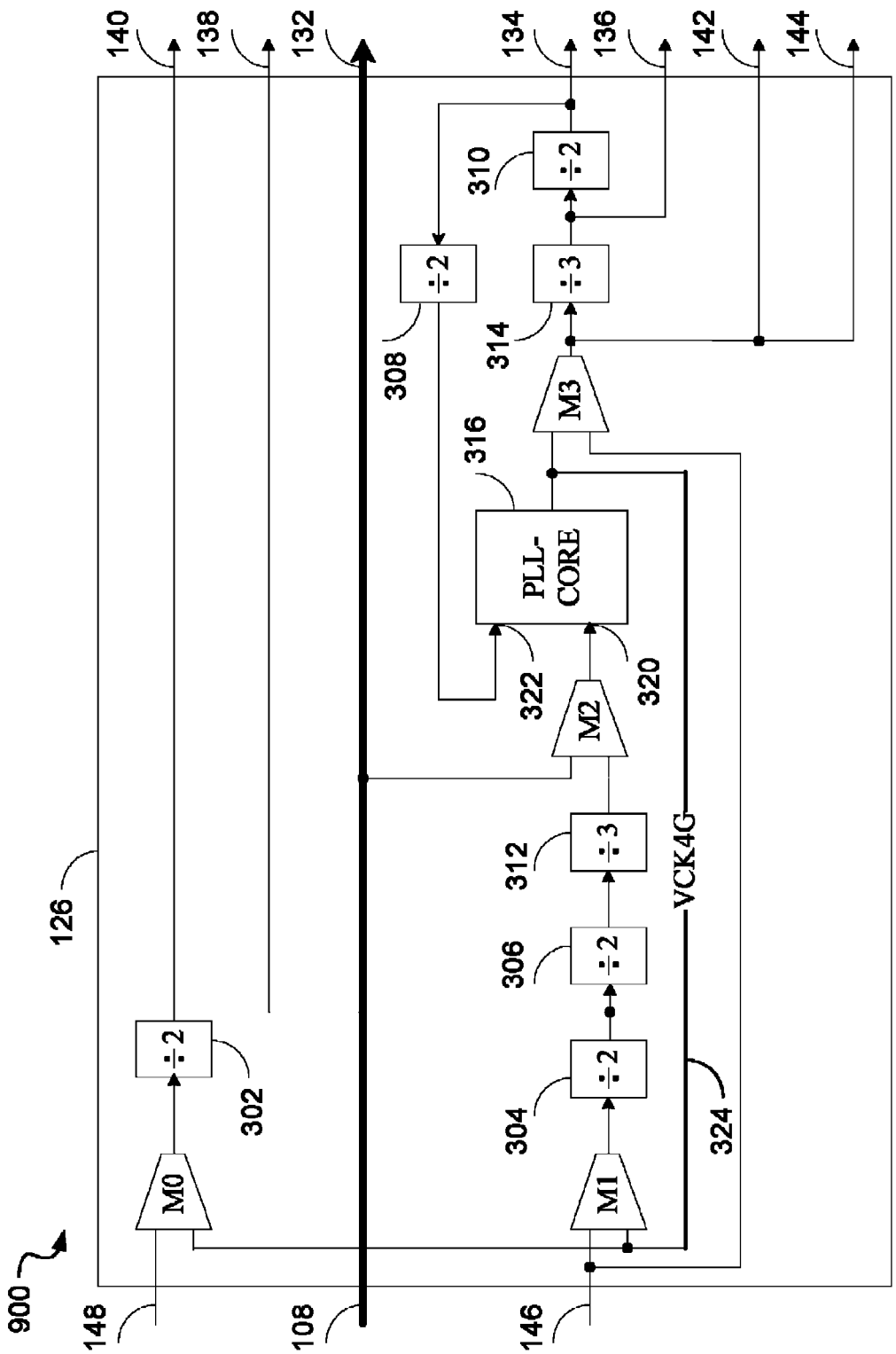
FIG. 9 shows the MPLL 126 of FIG. 3 in a power-down clocking mode 900.

FIG. 9 shows the MPLL 126 in a power-down clocking mode 900 in which the MPLL 126 is disabled. In such a case, the only clock kept 'alive' is the repeated reference clock CCK333M 132 that is driven directly from the system reference clock 108. It will be noted that after a 'cold' reset, the MPLL 10 will be in the power-down clocking mode 900 until it is configured in one of the other clocking modes by the core logic 128.

Figure 10:
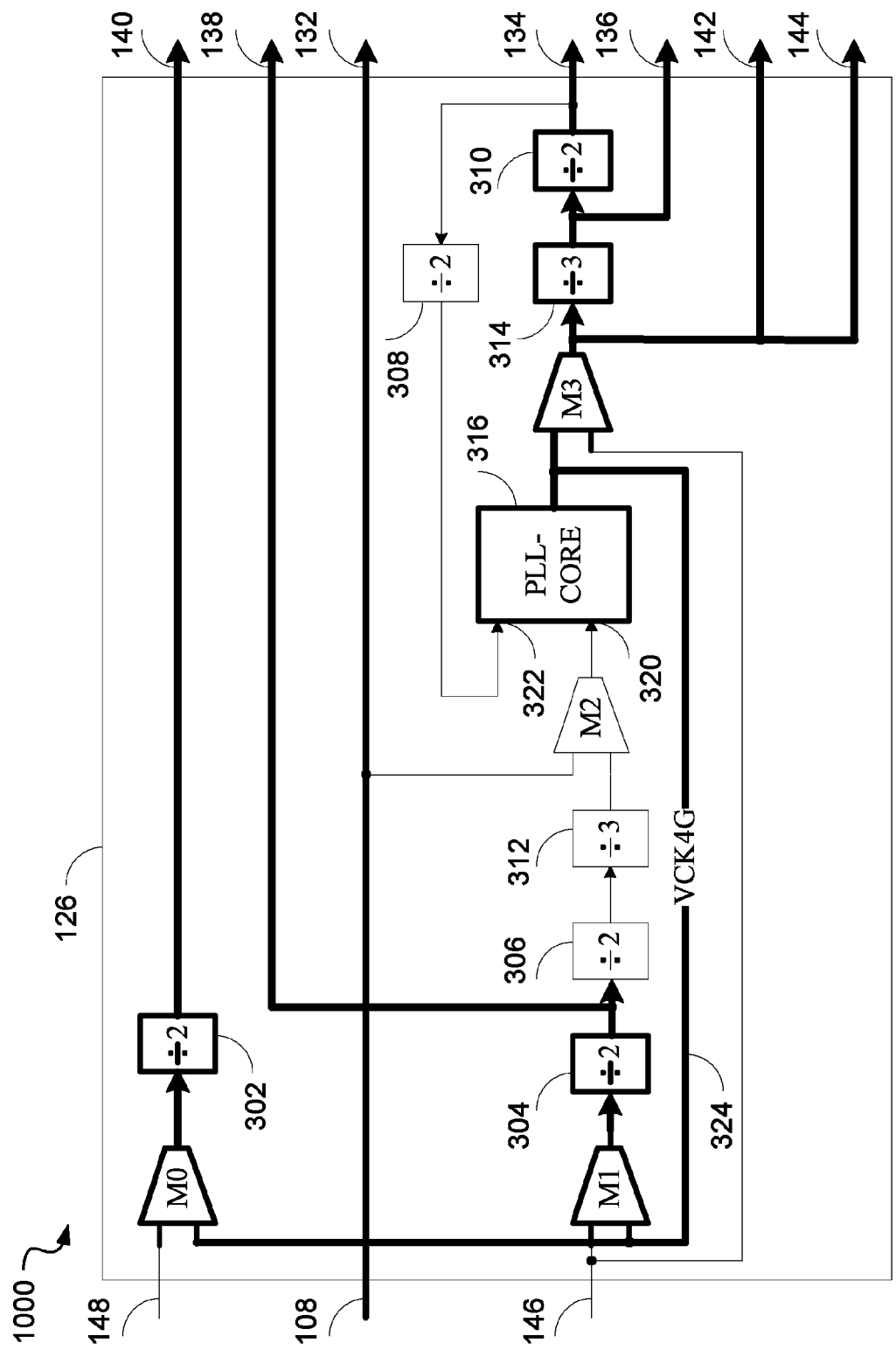
FIG. 10 shows the MPLL 126 of FIG. 3 in a test clocking mode 1000.

FIG. 10 shows the MPLL 126 in a test clocking mode 1000 in which all output clocks (except the repeated reference clock CCK333M 132) are derived from the output of the PLL-Core 316, but without a fully functional PLL (such as the PLL 402 of FIGS. 4) being formed. Each of the output clocks is derived from the output of the PLL-Core 316 as follows:
the core clock CCK667M 134 through the multiplexer M3, the divide-by-three block 314, and the divide-by-three block 310;
the DDR-PHY clock CCK1333M 136 through the multiplexer M3, and the divide-by-three block 314;
the primary receive clock PRCK2G 138 through the multiplexer M1, and the divide-by-two block 304;
the secondary receive clock SRCK2G 140 through the multiplexer M0, and the divide-by-two block 302;
the primary transmit clock PTCK4G 142 through the multiplexer M3; and
the secondary transmit clock STCK4G 144 through the multiplexer M3.

The test clocking mode 1000 is typically used only for test purposes. It allows the measurement of the tuning characteristics of the VCO of the PLL-Core 316.

FIGS. 3 to 10 have been shown to illustrate the principal functionality of the MPLL 126 and its seven clocking modes.

Figure 11:
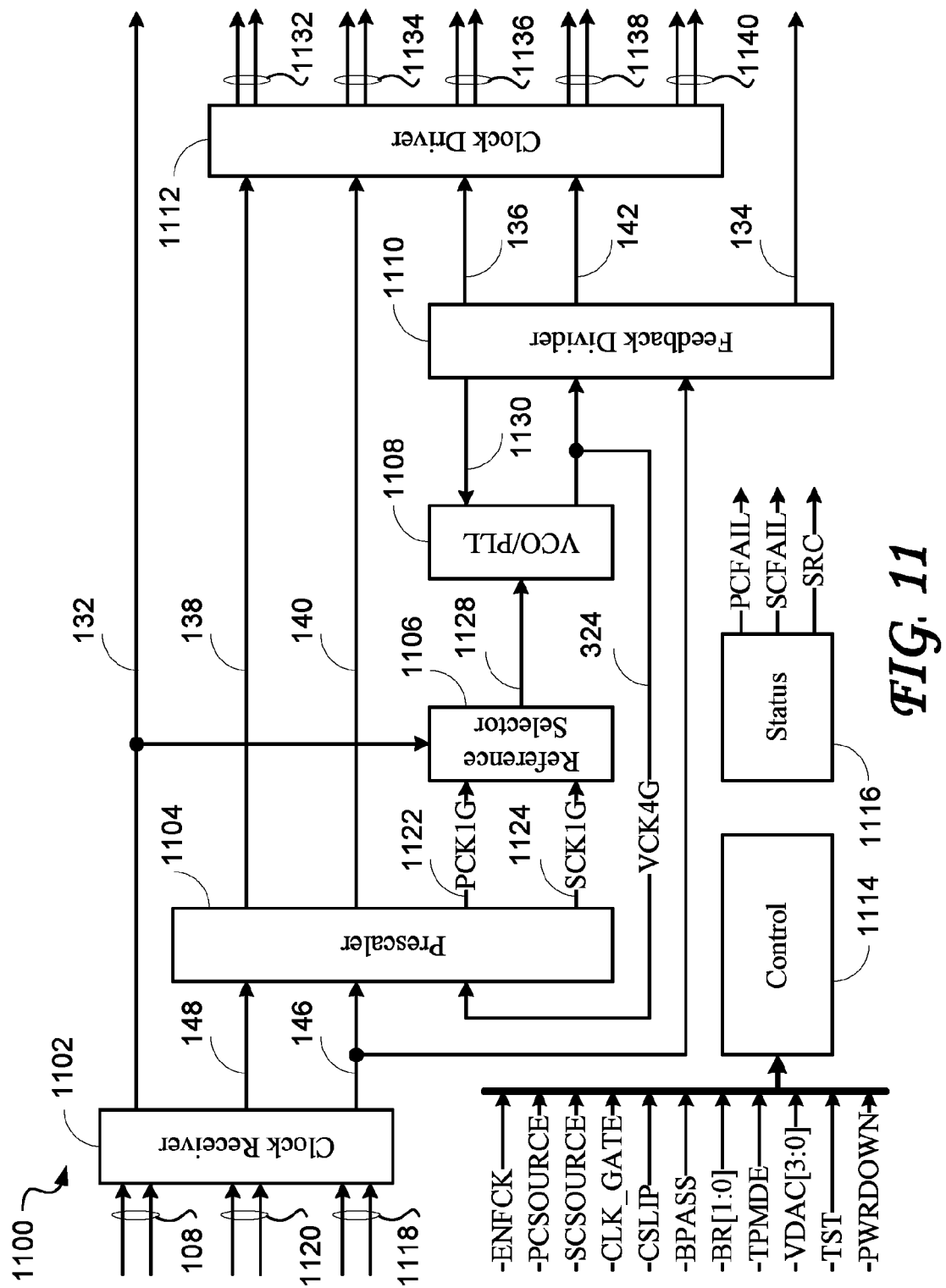
FIG. 11 shows an implementation specific block diagram 1100 of the MPLL 126.

FIG. 11 shows an implementation specific block diagram 1100 of the MPLL 126 comprising the following sub-blocks:
a Clock Receiver 1102;
a Prescaler 1104;
a Reference Selector 1106;
a VCO/PLL 1108;
a Feedback Divider 1110;
a Clock Driver 1112;
a Control Block 1114; and
a Status Block 1116.

As this implementation specific block diagram 1100 relates to the same MPLL 126 as the simplified block diagram 300 of FIG. 3, the same reference numerals as in FIG. 3 are used to denote equal signals. Each sub-block provides functionality which is summarized as follows.

The Clock Receiver 1102 receives differential current mode clock signals 1118 and 1120 and outputs them as the primary forwarded clock PFWCK4G 146 and the secondary forwarded clock SFWCK4G 148 in the form of Current Mode Logic (CML) signals which are connected to the prescaler the Prescaler 1104; the primary forwarded clock PFWCK4G 146 is also connected to the feedback divider 1110. Further, the Clock Receiver 1102 receives the system reference clock 108 in the form of a differential HSCL signal and outputs it as the repeated reference clock CCK333M 132 in the form of a CMOS compatible clock which is connected to the Reference Selector 1106, and also forwarded to the digital core logic 128 (see FIG., 1).

The Prescaler 1104 receives the high frequency forwarded clocks (PFWCK4G 146, SFWCK4G 148) and generates the primary and secondary receive clocks PRCK2G 138 and SRCK2G 140 respectively. Two more internal clocks, an internal primary clock PCK1G 1122 and an internal secondary clock SCK1G 1124, are also generated in the Prescaler 1104, and connected to the reference selector 1106. The Prescaler 1104 also receives the high-speed VCO clock VCK4G 1126 from the output of the VCO/PLL 1108. Due to the high frequency of these clocks, the Prescaler 1104 is implemented in current mode logic (CML). It is one of the functions of the Prescaler 1104 to reduce the frequencies of the high frequency forwarded clocks (PFWCK4G 146, SFWCK4G 148) to a lower frequency for subsequent selection in the Reference Selector 1106.

The Prescaler 1104 is described in greater detail in FIG. 12 below.

The Reference Selector 1106 receives the internal primary and secondary clocks PCK1G 1122 and SCK1G 1124 respectively that are received from the Prescaler 1104, as well as the repeated reference clock CCK333M 132, and outputs a selected PLL reference clock 1128 to the VCO/PLL 1108. The internal primary and secondary clocks (PCK1G 1122 and SCK1G 1124) are monitored in the Reference Selector 1106, and in case of failure of either of these, the Reference Selector 1106 delivers the repeated reference clock CCK333M 132 to the VCO/PLL 1108 instead of the (divided down) internal primary clock PCK1G 1122. The reference selector 54 is described in greater detail in FIG. 13 below.

The VCO/PLL 1108 forms the core of the MPLL 126. It receives the PLL reference clock 1128 from the Reference Selector 1106 and a feedback clock 1130 from the Feedback Divider 1110, and outputs the high-speed VCO clock VCK4G 1126. The VCO/PLL 1108 is described in greater detail in FIG. 15 below.

The Feedback Divider 1110 closes the loop of the MPLL 126. It receives the high-speed VCO clock VCK4G 1126 from the VCO/PLL 1108 and outputs the feedback clock 1130 back the VCO/PLL 1108. The Feedback Divider 1110 also generates the core clock CCK667M 134, the DDR-PHY clock CCK1333M 136, and the primary transmit clock PTCK4G 142, as shown in FIG. 3. Note that the secondary transmit clock STCK4G 144 is merely a replica of the primary transmit clock PTCK4G 142 (see FIG. 3) and will be generated in the Clock Driver 1112. The transmit clocks can be glitch free inhibited. Furthermore, transmit clock pulses can be swallowed as described in detail in the earlier patent applications to the same assignee Ser. No. 11/984,852 "A VOLTAGE CONTROLLED OSCILLATOR (VCO) WITH A WIDE TUNING RANGE AND SUBSTANTIALLY CONSTANT VOLTAGE SWING OVER THE TUNING RANGE" to Pfaff, Dirk filed Nov 23, 2007; and Ser. No. 12/081,380 "IMPROVED LINEAR PHASE INTERPOLATOR AND PHASE DETECTOR" to Yosefi Moghaddam filed Apr. 15, 2008, both applications being incorporated herein by reference.

The Clock Driver 1112 receives the primary receive clock PRCK2G 138, the secondary receive clock SRCK2G 140, the DDR-PHY clock CCK1333M 136, and the primary transmit clock PTCK4G 142 which are CML clock signals and converts them into corresponding differential current mode signals 1132, 1134, 1136, and 1138 which will be injected into transmission lines (see FIG. 2). The secondary transmit clock STCK4G 144 is generated by replicating the primary transmit clock PTCK4G 142 and outputted as a differential current mode signals 1140. It will be noted that the clock driver 1112 is disabled during the transparent clocking mode 800 (see FIG. 8), in which no high-frequency clocks are generated.

A number of the sub-blocks of the implementation specific block diagram 1100 of the MPLL 126 also have inputs for control signals and/or generate output signals representing status. To present the diagram in an uncluttered form, these signals are collectively shown as inputs to the (virtual) Control Block 1114 and outputs from the (virtual) Status Block 1116. These signals are coupled to the digital core logic 128 for controlling and monitoring aspects of the MPLL 126 as will become apparent in the more detailed description of certain of the sub-blocks to follow.

In summary, the following eleven control signals are listed:
Forward Clock Enable (ENFCK);
Clock source on primary side (PCSOURCE);
Clock source on secondary side (SCSOURCE);
Master transmit clock synchronization (CLK_GATE);
Master transmit clock cycle slip (CSLIP);
PLL bypass mode (BPASS);
System baud rate indicator (BR[1:0]);
Transparent mode (TPMDE);
VCO test mode tuning voltage (VDAC[3:0])
VCO test mode (TST)
Subsystem shutdown (PWRDOWN) and the following three status indicator signals:
Forwarded clock failure on primary side (PCFAIL);
Forwarded clock failure on secondary side (SCFAIL); and
PLL reference clock source indicator (CSOURCE).

Figure 12:
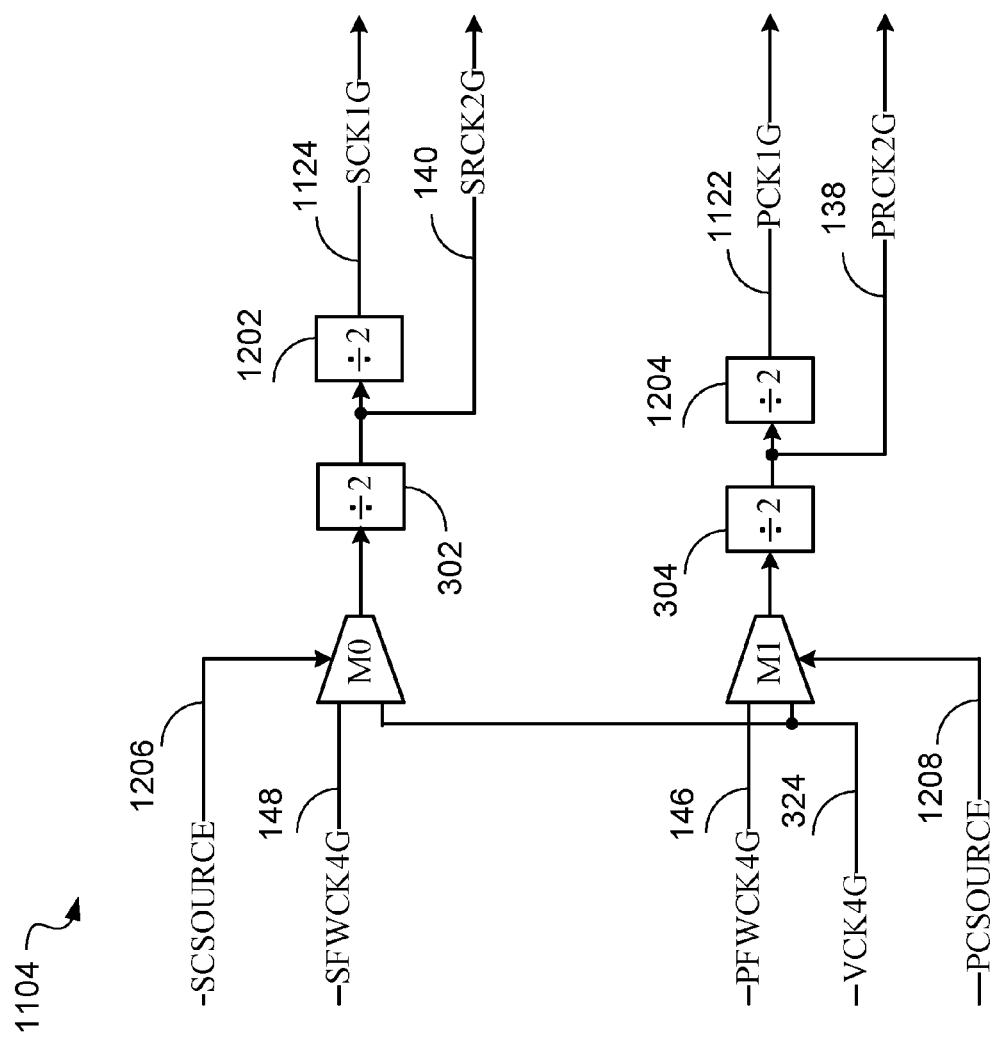
FIG. 12 shows a block diagram of the Prescaler 1104 of FIG. 11.

FIG. 12 shows a block diagram of the Prescaler 1104, including the multiplexers M0 and M1 (cf. FIG. 3), the divide-by-two blocks 302 and 304 (also from FIG. 3), and two additional divide-by-two blocks 1202 and 1204. The secondary forwarded clock SFWCK4G 148 and the primary forwarded clock PFWCK4G 146 are multiplexed with the high-speed VCO clock VCK4G 324 in the multiplexers M0 and M1 respectively. The multiplexers M0 and M1 outputting the multiplexed clocks are controlled by the control signals SCSOURCE 1206 and PCSOURCE 1208 respectively. Table 3 below illustrates the relationship between these control signals and the multiplexers M0 and M1.

TABLE 3

| Prescaler multiplexer control | | | |
|---|---|---|---|
| M0 | | M1 | |
| SCSOURCE | Active Clock | PCSOURCE | Active Clock |
| 0 | VCOCK4G | 0 | VCOCK4G |
| 1 | SFWCK4G | 1 | PFWCK4G |

The output of the multiplexer M0 is fed to a divider chain comprised of the divide-by-two blocks 302 and 1202 where the (first) divide-by-two block 302 generates the secondary receive clock SRCK2G 140, and the (second) divide-by-two block 1202 generates the internal secondary clock SCK1G 1124. Similarly, the output of the multiplexer M1 is fed to another divider chain comprised of the divide-by-two blocks 304 and 1204 where the (first) divide-by-two block 304 generates the primary receive clock PRCK2G 138, and the (second) divide-by-two block 1204 generates the internal primary clock PCK1G 1122. The clock signals generated by each divider chain are 4UI (four unit interval) fast CML clock signals (PRCK2G 138, SRCK2G 140) and 8UI clock signals (PCK1G 1122, SCK1G 1124) which are subsequently amplified to CMOS level (amplifiers not shown). The outputs of all divide-by-two blocks provide 50% duty cycle clocks. A fully synchronous divider topology may be chosen in order to minimize divider induced phase noise.

Figure 13:
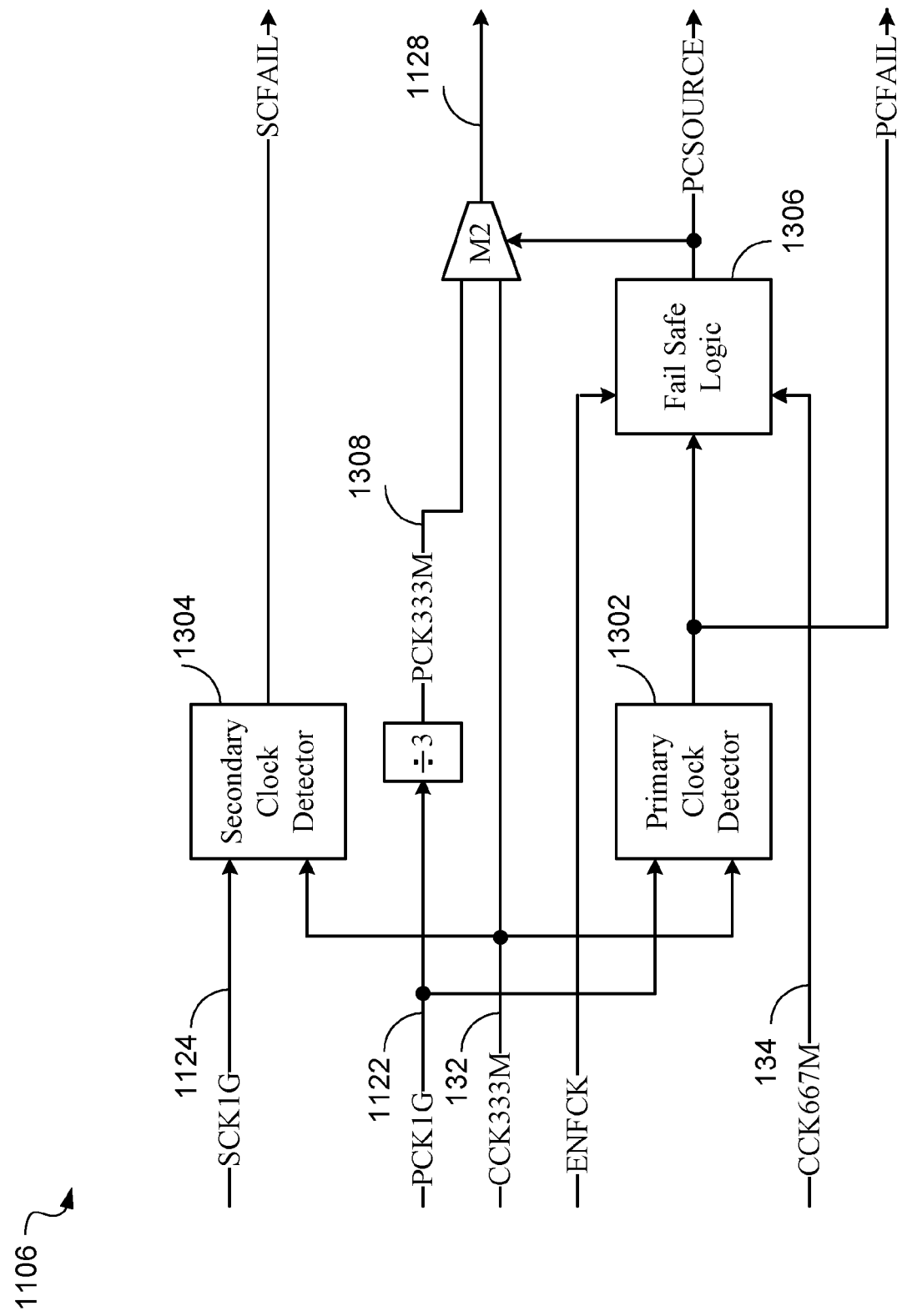
FIG. 13 shows a block diagram of the Reference Selector 1106 of FIG. 11.

FIG. 13 shows a block diagram of the Reference Selector 1106. The Reference Selector 1106 comprises a Primary Clock Detector 1302, a Secondary Clock Detector 1304, a Fail Safe Logic 1306, the divide-by-three block 312 (from FIG. 3), and the multiplexer M2 (also from FIG. 3), and is preferentially implemented as a CMOS-only building block. The Reference Selector 1106 receives three input clocks: the internal primary clock PCK1G 1122, the internal secondary clock SCK1G 1124, and the repeated reference clock CCK333M 132, and outputs the PLL reference clock 1128, as shown in FIG. 11.

It is a function of the Reference Selector 1106 to reduce the frequency of the internal primary clock PCK1G 1122 further, to the nominal value of the repeated reference clock CCK333M 132, such that the selection of clocks of nominally the same frequency can occur at a lowest common reference frequency, for example 333 MHz.

The internal primary clock PCK1G 1122, having a clock period of 8 Unit Intervals (UI) with respect to the data rate, is reduced in frequency by three in the divide-by-three block 312 (preferably a synchronous circuit), which outputs a clock PCK333M 1308 with a 24 UI period. This clock and the repeated reference clock CCK333M 132, both of nominally the same frequency, are input to the 2-to-1 multiplexer M2 which selects one of these clocks to be output as the PLL reference clock 1128.

In the preferred embodiment of the invention, there is no need for, nor provision made for, deriving the PLL reference clock 1128 from the secondary forwarded clock. The Reference Selector 1106 could be easily expanded to include this capability by providing additional circuitry similar to that already provided.

The remaining part of the Reference Selector 1106 provides clock detection and controls the select input of the multiplexer M2, The repeated reference clock CCK333M 132 and the internal primary clock PCK1G 1122 are input to the Primary Clock Detector 1302 which outputs the status indicator PCFAIL indicating the presence or failure of the forwarded clock failure on primary side. Similarly, the repeated reference clock CCK333M 132 and the internal secondary clock SCK1G 1124 are input to the Secondary Clock Detector 1304 which outputs the status indicator SCFAIL indicating the presence or failure of the forwarded clock failure on secondary side.

Figure 14:
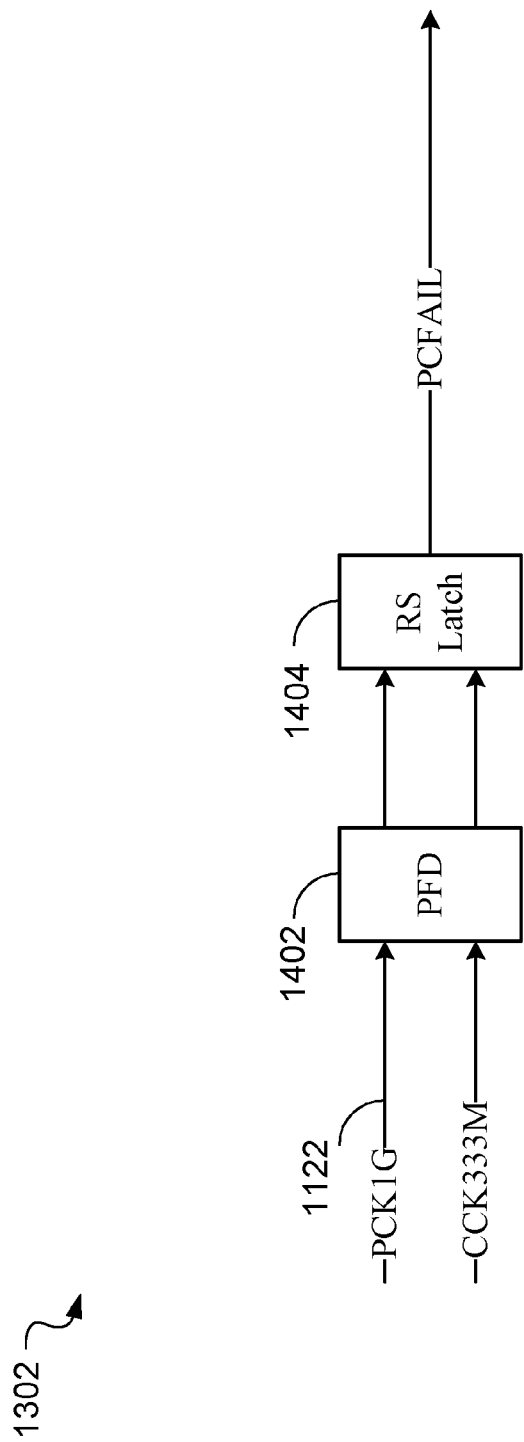
FIG. 14 shows a block diagram of the Primary Clock Detector 1302 of FIG. 13.

FIG. 14 shows a block diagram of the Primary Clock Detector 1302 of FIG. 13 comprising a phase frequency detector (PFD) 1402 coupled to an RS-latch 1404. The PFD 1402 is driven by the repeated reference clock CCK333M 132 and the internal primary clock PCK1G 1122, which derives from the primary forwarded clock. Because the frequency of the internal primary clock PCK1G 1122 is three times higher than the frequency of the repeated reference clock CCK333M 132, the PFD always 'leans' towards the higher frequency and continuously resets the RS-latch 1404, which will deliver a logical zero at its output, the status indicator PCFAIL thus indicating the presence of the primary forwarded clock. If however the internal primary clock PCK1G 1122 should fail or not be present at all, the output of the RS-latch 1404 will instantaneously change to a logical high, thus indicating the failure or absence of the primary forwarded clock. The Secondary Clock Detector 1302 comprises a similar circuit for determining the presence or absence of the secondary forwarded clock.

The Fail Safe Logic 1306 receives three inputs: the PCFAIL status signal from the Primary Clock Detector 1302, the Forward Clock Enable control signal ENFCK, and the core clock CCK667M 134. It outputs the PCSOURCE status signal which is coupled to the select input of the multiplexer M2. The Fail Safe Logic 1306 is preferably implemented in the form of a synchronous finite state machine (FSM).

Through the logic level of the Forward Clock Enable control signal ENFCK, the digital core logic 128 indicates to the MPLL 126 whether it should synchronize to the forwarded clock or the system reference clock (by selection in M2). Even though the Forward Clock Enable control signal ENFCK may be set to indicate that the forwarded clock should be selected, the PCFAIL status signal from the clock detector may indicate that the forwarded clock is not available. In this case, The Fail Safe Logic 1306 ensures that only a working clock is selected. The PCSOURCE status signal indicates which clock is actually multiplexed as the selected PLL reference clock 1128.

The level of the multiplexer select (the PCSOURCE status signal) depends on two things, namely, the output of the Primary Clock Detector 1302 (i.e. the PCFAIL status signal) and the logical level of the ENFCK control signal. If the internal primary clock PCK1G 1122 fails, the Fail Safe Logic 1306 will select repeated reference clock CCK333M 132. The level of the ENFCK control signal is relevant only if PCK1G 1122 is available. If, however, the internal primary clock PCK1G 1122 fails and then reappears, the ENFCK control signal must be kept low for at least one cycle and brought back high (by the core logic 128), in order to reselect the internal primary clock PCK1G 1122 again. Table 4 shown below lists the reference selector control input and status signals.

TABLE 4

Reference selector status/control signals

| Control Input | Name | | |
|---|---|---|---|
| ENFCK | Enable Forwarded Clock | 1 | Primary forwarded clock is preferred reference to the PLL |
| | | 0 | System reference clock (CCK333M) is reference clock to the PLL |
| Status Signal | Name | | |
| PCFAIL | Primary Forwarded Clock Failure | 1 | Primary forwarded clock failure |
| | | 0 | Primary forwarded clock detected |
| SCFAIL | Secondary Forwarded Clock Failure | 1 | Secondary forwarded clock failure |
| | | 0 | Secondary forwarded clock detected |
| CSOURCE | Reference source | 1 | Forwarded clock serves as active reference |
| | | 0 | CCK333M serves as active reference |

Figure 15:
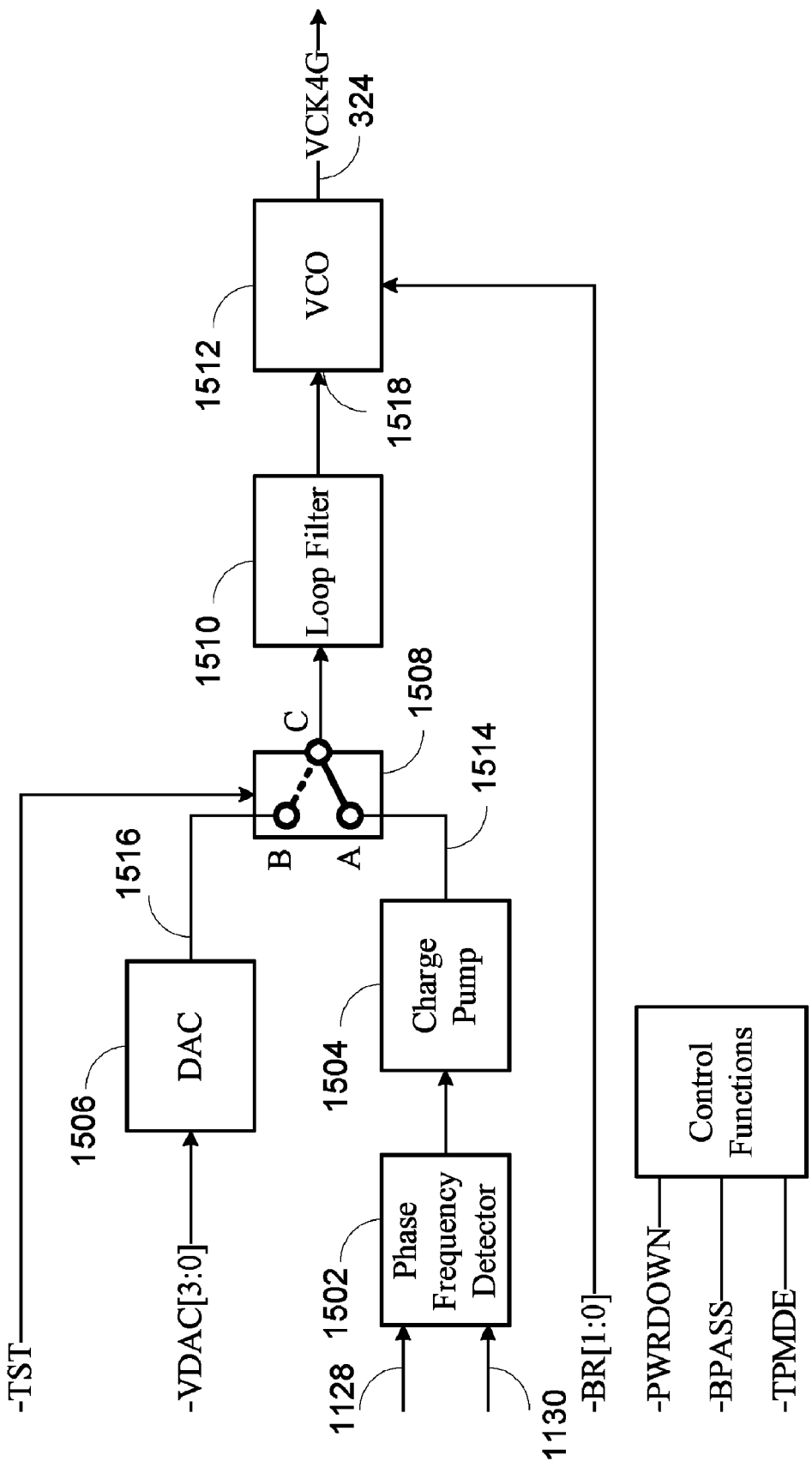
FIG. 15 shows a block level schematic of the VCO/PLL 1108 of FIG. 11.

FIG. 15 shows a block level schematic of the VCO/PLL 1108 comprising: a phase frequency detector 1502; a charge pump 1504; a 4-bit digital to analog converter (DAC) 1506; an analog multiplexer 1508; a loop filter 1510; and a voltage controlled oscillator (VCO) 1512. The clock inputs into the phase frequency detector 1502 are the selected PLL reference clock 1128 and the feedback clock 1130 from the Feedback Divider 1110 (FIG. 10). An output of the phase frequency detector 1502 drives the charge pump 1504 which outputs a frequency control voltage 1514 to a terminal "A" of the analog multiplexer 1508. The 4-bit DAC 1506 receives as its digital input signal the 4-bit VCO test mode tuning voltage VDAC and outputs a programmable frequency control voltage 1516 to a terminal "B" of the analog multiplexer 1508. A terminal "C" of the analog multiplexer 1508 is connected to the input of the loop filter 1510 whose output drives a tuning input 1518 of the VCO 1512. The VCO output is the high-speed VCO clock VCK4G 324 that is connected to the Feedback Divider 1110 (FIG. 11). Together with the Feedback Divider 1110, the VCO/PLL 1108 functions like a conventional phase-frequency-detector, charge pump (PFD-CP) based PLL. A PLL is a negative feedback system in which the PFD-CP (or generally the phase detector) compares a reference clock with a feedback clock to generate a phase error voltage that is used directly or indirectly (e.g. through the loop filter) as the frequency control voltage driving the VCO. The phase error voltage is updated continuously as the frequency of the VCO varies until phase locking is achieved, which is indicated by the convergence of the phase error voltage to a substantially constant value. The loop filter 1510 is of passive nature, including two capacitors and a resistor. This leads to a type-II, third order loop. The VCO/PLL 1108 output delivers a single CML compatible output at ½ of the system baud rate, while phase comparison is done at 1/24 of the system baud rate.

In normal PLL operation, the analog multiplexer 1508 is set to connect the terminal "A" to the terminal "C", thus sending the output of the charge pump 1504 to the input of the loop filter 1510. In order to facilitate testing of the VCO/PLL 1108, the 4-bit digital to analog converter (DAC) 1506 provides the programmable frequency control voltage 1516 through the analog multiplexer 1508 and the loop filter 1510 to the tuning input 1518 of the VCO 1512. The DAC 1506 voltage is programmed by a binary value at the VDAC input.

In the test clocking mode 1000, the analog multiplexer 1508 is set by the TST control signal to connect the terminal "B" to the terminal "C", thus sending the programmable frequency control voltage 1516 from the out put of the DAC to the input of the loop filter 1510. Table 5 shows an exemplary relationship between the programmable frequency control voltage 1516 from the DAC 1506 voltage as a proportion of the supply voltage VDD and the binary value at the VDAC input.

TABLE 5

VCO/PLL DAC settings

| Setting | VDAC[3:0] | Voltage/VDD |
|---|---|---|
| 0 | b0000 | 0.0625 |
| 1 | b0001 | 0.125 |
| 2 | b0010 | 0.1875 |
| 3 | b0011 | 0.25 |
| 4 | b0100 | 0.3125 |
| 5 | b0101 | 0.375 |
| 6 | b0110 | 0.4375 |
| 7 | b0111 | 0.5 |
| 8 | b1000 | 0.5625 |
| 9 | b1001 | 0.625 |
| 10 | b1010 | 0.6875 |
| 11 | b1011 | 0.75 |
| 12 | b1100 | 0.8125 |
| 13 | b1101 | 0.875 |
| 14 | b1110 | 0.9375 |
| 15 | b1111 | 1 |

Phase locking of the VCO/PLL 1108 is supported by indication of the system baud rate. This information is passed to the sub-block with the system baud rate indicator (BR[1:0]) which is connected to a bias input of the VCO 1512. The system baud rate indicator (BR) may be used to bias the VCO 1512 to be centered at approximately the frequency required for the different baud rates. Table 6 shows the VCO/PLL baud rate setting against the system baud rate indicator (BR[1:0]), listing for each setting the binary value of BR[1:0], the frequency of the System Reference Clock 108, and the System Baud Rate.

TABLE 6

VCO/PLL baud rate setting

| Setting | BR[1:0] | System Reference Clock | System Baud Rate |
|---|---|---|---|
| 0 | b00 | 133.33 MHz | 3.2 Gb/s |
| 1 | b01 | 166.67 MHz | 4.0 Gb/s |
| 2 | b10 | 200 MHz | 4.8 Gb/s |
| 3 | b11 | 266.66 MHz | 6.4 Gb/s |

It will be noted that the baud-rate is not relevant in the transparent clocking mode 800. In the latter mode, the VCO/PLL 1108 comparison frequency is fixed at 100 MHz. The functions of the control inputs of the VCO/PLL 1108 are summarized in Table 7.

TABLE 7

VCO/PLL control settings

| Control Input | Name | | |
|---|---|---|---|
| PWRDOWN | Block power down | 0 | Normal operation |
| | | 1 | VCO/PLL shut down |
| TST | VCO test mode | 0 | Normal PLL operation |
| | | 1 | VCO driven by VDAC |
| BPASS | Bypass clocking mode | 0 | Normal PLL operation |
| | | 1 | VCO/PLL bypassed |
| TPMDE | Transparent clocking mode | 0 | No transparent mode (i.e. baud rate setting is relevant) |
| | | 1 | Transparent mode, system reference equal to 100 MHz |

Alternative embodiments of the multi reference PLL of the invention include different frequency regimes for applications that differ from the FBDIMM applications but which nonetheless require the ability to select reference clocks with different frequencies and which require the generation of multiple clocks with harmonically related frequencies. Such modifications may principally include dividers to reduce clocks by different ratios, and placing multiplexers in appropriate places.

In summary, the MPLL 126 thus provides the ability to generate a number of harmonically related clock frequencies which may be locked to one of several reference frequencies. Furthermore, the MPLL 126 provides a number of clocking modes, including modes to facilitate testing and powering down of sections of the circuitry for conserving power.

Although embodiments of the invention have been described in detail, it will be apparent to one skilled in the art that variations and modifications to the embodiment may be made within the scope of the following claims.

The invention claimed is:

1. A multi reference phase locked loop (MPLL) for generating a high speed clock having a high speed clock frequency and phase locking it to a lowest common reference frequency derived from a selected one of at least two reference clocks, the MPLL comprising:
   (a) a prescaler for reducing frequency of at least one of said at least two reference clocks, comprising a first multiplexer for multiplexing the high speed clock and the at least two reference clocks into a multiplexed clock; and a divider circuit for reducing frequency of the multiplexed clock;
   (b) a reference selector for selecting the selected one of said at least two reference clocks after its frequency has been reduced in the reference selector to the lowest common reference frequency;
   (c) a phase detector for comparing the selected one of the at least two reference clocks with a feedback clock, and generating a frequency control voltage indicative of a phase error between the compared clocks;
   (d) a voltage controlled oscillator (VCO) for generating the high speed clock having the high speed clock frequency based on the frequency control voltage until phase locking is indicated by a convergence of the phase error to a substantially constant value; and
   (e) a feedback divider for processing the high speed clock into the feedback clock with the same lowest common reference frequency.

2. The system of claim 1, wherein one of the reference clocks is a forwarded clock, and another of the reference clocks is a system reference clock.

3. The MPLL of claim 1, wherein the first multiplexer is controlled by a control signal enabling a selection of the forwarded clock.

4. The MPLL of claim 1, wherein the first multiplexer is controlled by a control signal enabling a selection of the high speed clock.

5. The MALL of claim 1, further comprising a divider circuit for further reducing the frequency of the multiplexed clock to the lowest common reference frequency.

6. The MPLL of claim 5, the reference selector further comprising a second multiplexer for selecting the selected one of the at least two reference clocks.

7. The MPLL of claim 5, further comprising a clock detector for determining a presence of the forwarded clock.

8. The MPLL of claim 7, further comprising a fail safe logic circuit for controlling the second multiplexer to select the forwarded clock only when its presence is indicated by the clock detector.

9. The MPLL of claim 1, further comprising:
  a digital to analog converter for generating a programmable frequency control voltage; and
  an analog multiplexer for alternatively selecting the frequency control voltage and the programmable frequency control voltage to drive the VCO.

10. The MPLL of claim 1, wherein the feedback divider comprises a plurality of clock dividers for generating clocks, one of which being the feedback clock.

11. A method for generating a high speed clock having a high speed clock frequency and phase locking it to a lowest common reference frequency derived from a selected one of at least two reference clocks, the method comprising:
  (a) reducing frequency of at least one of said at least two reference clocks, comprising multiplexing the high speed clock and the at least two reference clocks into a multiplexed clock: and reducing a frequency of the multiplexed clock;
  (b) selecting the selected one of said at least two reference clocks after its frequency has been reduced to the lowest common reference frequency;
  (c) comparing the selected one of the at least two reference clocks with a feedback clock, and generating a frequency control voltage indicative of a phase error between the compared clocks;
  (d) generating the high speed clock having the high speed clock frequency based on the frequency control voltage until phase locking is indicated by a convergence of the phase error to a substantially constant value; and
  (e) processing the high speed clock into the feedback clock with the same lowest common reference frequency.

12. The method of claim 11, wherein one of the reference clocks is a forwarded clock, and another of the reference clocks is a system reference clock.

13. The method of claim 11, wherein multiplexing comprises enabling a selection of the forwarded clock.

14. The method of claim 11, wherein multiplexing includes enabling a selection of the high speed clock.

15. The method of claim 11, further comprising reducing the frequency of the multiplexed clock to the lowest common reference frequency.

16. The method of claim 15, wherein multiplexing further comprises selecting the selected one of the at least two reference clocks.

17. The method of claim 13, wherein multiplexing further comprises determining a presence of the forwarded clock in a clock detector.

18. The method of claim 16, wherein multiplexing further comprises selecting the forwarded clock only when its presence is indicated by the clock detector.

19. The method of claim 11, further comprising:
  generating a programmable frequency control voltage; and
  alternatively selecting the frequency control voltage and the programmable frequency control voltage for driving a VCO.

20. The method of claim 11, further comprising generating clock signals in a plurality of clock dividers, one of the clock signals being the feedback clock.

* * * * *